(12) United States Patent
Fennimore et al.

(10) Patent No.: US 8,592,239 B2
(45) Date of Patent: Nov. 26, 2013

(54) PROCESS AND MATERIALS FOR MAKING CONTAINED LAYERS AND DEVICES MADE WITH SAME

(75) Inventors: Adam Fennimore, Wilmington, DE (US); Jonathan M. Ziebarth, Santa Barbara, CA (US); Nora Sabina Radu, Landenberg, PA (US)

(73) Assignee: E I du Pont de Nemours and Company, Wilmington, DE (US)

(*) Notice: Subject to any disclaimer, the term of this patent is extended or adjusted under 35 U.S.C. 154(b) by 937 days.

(21) Appl. No.: 12/643,403

(22) Filed: Dec. 21, 2009

(65) Prior Publication Data

US 2011/0017980 A1     Jan. 27, 2011

Related U.S. Application Data

(60) Provisional application No. 61/228,689, filed on Jul. 27, 2009.

(51) Int. Cl.
  *H01L 21/00*     (2006.01)

(52) U.S. Cl.
  USPC ............ 438/38; 257/40; 313/503; 313/504

(58) Field of Classification Search
  USPC ................. 257/40; 313/503, 504; 438/38
  See application file for complete search history.

(56) References Cited

U.S. PATENT DOCUMENTS

| | | | |
|---|---|---|---|
| 3,282,875 A | 11/1966 | Connolly et al. | |
| 3,720,515 A * | 3/1973 | Stanley | 430/313 |
| 4,358,545 A | 11/1982 | Ezzell et al. | |
| 4,433,082 A | 2/1984 | Grot et al. | |
| 4,940,525 A | 7/1990 | Ezzell | |
| 5,061,569 A | 10/1991 | VanSlyke et al. | |
| 5,392,980 A | 2/1995 | Swamy et al. | |
| 5,435,887 A | 7/1995 | Rothschild et al. | |
| 5,463,005 A | 10/1995 | Desmarteau | |

(Continued)

FOREIGN PATENT DOCUMENTS

| | | |
|---|---|---|
| CN | 1327360 A | 12/2001 |
| EP | 1026152 A1 | 8/2000 |

(Continued)

OTHER PUBLICATIONS

International Search Report, Korean Intellectual Property Office, Daejeon, Republic of Korea, in PCT/2009/068918, PCT Counterpart for present U.S. Appl. No. 12/643,403, Jun Gyu Kim, Authorized Officer, Jul. 26, 2010.

(Continued)

*Primary Examiner* — David Vu
*Assistant Examiner* — Brandon Fox

(57) ABSTRACT

There is provided a process for forming a contained second layer over a first layer, including the steps:
  forming the first layer having a first surface energy;
  treating the first layer with a priming layer;
  exposing the priming layer patternwise with radiation resulting in exposed areas and unexposed areas;
  developing the priming layer to effectively remove the priming layer from either the exposed areas or the unexposed areas resulting in a first layer having a pattern of priming layer, wherein the pattern of priming layer has a second surface energy that is higher than the first surface energy; and
  forming the second layer by liquid depositions on the pattern of priming layer on the first layer. There is also provided an organic electronic device made by the process.

14 Claims, 3 Drawing Sheets

(56) References Cited

U.S. PATENT DOCUMENTS

| | | | |
|---|---|---|---|
| 5,728,801 A | 3/1998 | Wu et al. |
| 5,922,481 A | 7/1999 | Etzbach et al. |
| 5,929,194 A | 7/1999 | Woo et al. |
| 6,087,196 A | 7/2000 | Sturm et al. |
| 6,150,426 A | 11/2000 | Curtin et al. |
| 6,303,238 B1 | 10/2001 | Thompson et al. |
| 6,309,763 B1 | 10/2001 | Woo et al. |
| 6,465,742 B1 | 10/2002 | Hiraoka et al. |
| 6,670,645 B2 | 12/2003 | Grushin et al. |
| 6,736,985 B1 | 5/2004 | Bao et al. |
| 6,852,249 B2 | 2/2005 | Li et al. |
| 6,852,429 B1 | 2/2005 | Li et al. |
| 7,173,131 B2 | 2/2007 | Saitoh et al. |
| 7,250,461 B2 | 7/2007 | Hsu et al. |
| 7,358,409 B2 | 4/2008 | Saitoh et al. |
| 7,375,250 B2 | 5/2008 | Saitoh et al. |
| 7,402,681 B2 | 7/2008 | Ong et al. |
| 7,402,701 B2 | 7/2008 | Kato et al. |
| 7,491,450 B2 | 2/2009 | Okinaka et al. |
| 7,651,788 B2 | 1/2010 | Seo et al. |
| 7,709,104 B2 | 5/2010 | Saitoh et al. |
| 7,772,360 B2 | 8/2010 | Kitano et al. |
| 8,124,172 B2 | 2/2012 | Lang et al. |
| 2001/0019782 A1 | 9/2001 | Igarashi et al. |
| 2001/0022497 A1 | 9/2001 | Aoki et al. |
| 2001/0035714 A1 | 11/2001 | Lu |
| 2002/0076576 A1 | 6/2002 | Li et al. |
| 2002/0180347 A1 | 12/2002 | Adachi et al. |
| 2003/0017360 A1 | 1/2003 | Tai et al. |
| 2003/0118866 A1 | 6/2003 | Oh et al. |
| 2003/0129321 A1 | 7/2003 | Aoki |
| 2003/0222250 A1 | 12/2003 | Hsu |
| 2004/0029133 A1 | 2/2004 | Herrnstadt |
| 2004/0079940 A1 | 4/2004 | Redecker et al. |
| 2004/0094768 A1 | 5/2004 | Yu et al. |
| 2004/0102577 A1 | 5/2004 | Hsu et al. |
| 2004/0106003 A1 | 6/2004 | Chen et al. |
| 2004/0127637 A1 | 7/2004 | Hsu et al. |
| 2004/0164293 A1 | 8/2004 | Maloney et al. |
| 2004/0175646 A1 | 9/2004 | Hatanaka et al. |
| 2004/0189190 A1 | 9/2004 | Suzuri et al. |
| 2004/0202863 A1 | 10/2004 | Saito et al. |
| 2004/0222412 A1 | 11/2004 | Bai et al. |
| 2004/0254297 A1 | 12/2004 | Hsu et al. |
| 2005/0003203 A1 | 1/2005 | Brown |
| 2005/0031898 A1 | 2/2005 | Li et al. |
| 2005/0051770 A1 | 3/2005 | Ando et al. |
| 2005/0062021 A1 | 3/2005 | Petrov et al. |
| 2005/0184287 A1 | 8/2005 | Herron et al. |
| 2005/0187411 A1 | 8/2005 | Herron et al. |
| 2005/0196969 A1 | 9/2005 | Gunner et al. |
| 2005/0205860 A1 | 9/2005 | Hsu et al. |
| 2005/0209422 A1 | 9/2005 | O'Dell et al. |
| 2005/0236614 A1 | 10/2005 | Parker |
| 2005/0269550 A1 | 12/2005 | Petrov et al. |
| 2006/0007520 A1 | 1/2006 | Takakuwa et al. |
| 2006/0052641 A1 | 3/2006 | Funahashi |
| 2006/0113528 A1 | 6/2006 | Okinaka et al. |
| 2006/0115678 A1 | 6/2006 | Saitoh et al. |
| 2006/0121312 A1 | 6/2006 | Yamada et al. |
| 2006/0124061 A1 | 6/2006 | Saito |
| 2006/0159838 A1 | 7/2006 | Kowalski et al. |
| 2006/0267488 A1 | 11/2006 | Saitoh et al. |
| 2006/0275547 A1 | 12/2006 | Lee et al. |
| 2007/0020395 A1 | 1/2007 | Lang et al. |
| 2007/0114917 A1 | 5/2007 | Funahashi et al. |
| 2007/0205409 A1 | 9/2007 | Lecloux et al. |
| 2007/0218582 A1 | 9/2007 | Lang et al. |
| 2007/0255076 A1 | 11/2007 | Ito et al. |
| 2007/0264155 A1 | 11/2007 | Brady et al. |
| 2007/0298530 A1* | 12/2007 | Feehery ................ 438/46 |
| 2008/0067924 A1* | 3/2008 | Prakash et al. ........... 313/504 |
| 2008/0087882 A1 | 4/2008 | Lecloux et al. |
| 2008/0121846 A1 | 5/2008 | Hsu et al. |
| 2008/0191614 A1 | 8/2008 | Kim et al. |
| 2008/0217644 A1 | 9/2008 | Sorich |
| 2008/0220561 A1 | 9/2008 | Karg et al. |
| 2008/0233433 A1 | 9/2008 | Igarashi et al. |
| 2008/0286487 A1* | 11/2008 | Lang et al. .................. 427/532 |
| 2008/0286605 A1 | 11/2008 | Takeda et al. |
| 2009/0058279 A1 | 3/2009 | Takeda |
| 2009/0130296 A1 | 5/2009 | Kwong et al. |
| 2010/0213454 A1 | 8/2010 | Lang et al. |
| 2011/0092076 A1 | 4/2011 | Lang et al. |

FOREIGN PATENT DOCUMENTS

| | | |
|---|---|---|
| EP | 1128438 A1 | 8/2001 |
| EP | 1191612 A2 | 3/2002 |
| EP | 1191614 A2 | 3/2002 |
| EP | 1647566 A2 | 4/2006 |
| EP | 2067766 A1 | 10/2009 |
| EP | 2067767 A1 | 10/2009 |
| JP | 54016203 A | 2/1979 |
| JP | 63104683 A | 5/1988 |
| JP | 09203803 A | 8/1997 |
| JP | 2001237069 A | 8/2001 |
| JP | 2003123967 A | 4/2003 |
| JP | 2003297582 A | 10/2003 |
| JP | 2003338380 A | 11/2003 |
| JP | 2004-10550 A | 1/2004 |
| JP | 2004047176 A | 2/2004 |
| JP | 2004071286 A | 3/2004 |
| JP | 2004177793 A | 6/2004 |
| JP | 2004199086 A | 7/2004 |
| JP | 2004234901 A | 8/2004 |
| JP | 2004355949 A | 12/2004 |
| JP | 2005093751 A | 4/2005 |
| JP | 2005232452 A | 9/2005 |
| JP | 2006-151844 A | 6/2006 |
| JP | 2006-219392 A | 8/2006 |
| JP | 2007-186449 A | 7/2007 |
| KR | 10-2009-0046731 A | 5/2009 |
| KR | 10-2009-0086015 A | 8/2009 |
| KR | 10-2009-0086920 A | 8/2009 |
| KR | 10-2009-0093897 A | 9/2009 |
| WO | 9831716 A1 | 7/1998 |
| WO | 9952954 A1 | 10/1999 |
| WO | 0070655 A2 | 11/2000 |
| WO | 0141512 A1 | 6/2001 |
| WO | 0202714 A2 | 1/2002 |
| WO | 0215645 A1 | 2/2002 |
| WO | 03/008424 A1 | 1/2003 |
| WO | 03006537 A1 | 1/2003 |
| WO | 03/040257 A1 | 5/2003 |
| WO | 03063555 A1 | 7/2003 |
| WO | 03/091688 A2 | 11/2003 |
| WO | 2004/016710 A1 | 2/2004 |
| WO | 2004042474 A1 | 5/2004 |
| WO | 2005031889 A1 | 4/2005 |
| WO | 2005/052027 A1 | 6/2005 |
| WO | 2006043087 A1 | 4/2006 |
| WO | 2006070713 A1 | 7/2006 |
| WO | 2006072095 A2 | 7/2006 |
| WO | 2006117914 A1 | 11/2006 |
| WO | 2007/108666 A1 | 9/2007 |
| WO | WO2007-100096 A1 | 9/2007 |
| WO | WO2007-105917 A1 | 9/2007 |
| WO | 2007145978 A1 | 12/2007 |
| WO | 2008/024378 A2 | 2/2008 |
| WO | 2008/024379 A2 | 2/2008 |
| WO | 2008150940 A1 | 12/2008 |
| WO | WO2008-149968 A1 | 12/2008 |
| WO | 2009/018009 A1 | 2/2009 |
| WO | WO2009/028902 A2 | 3/2009 |
| WO | WO2009-055628 A1 | 4/2009 |
| WO | 2009067419 A1 | 5/2009 |
| WO | 2010035364 A1 | 4/2010 |
| WO | 2010099534 A2 | 9/2010 |

OTHER PUBLICATIONS

International Search Report, Korean Intellectual Property Office, Daejeon, Republic of Korea, in PCT/2010/025764, PCT copending

(56) References Cited

OTHER PUBLICATIONS

U.S. Appl. No. 12/714,880, Hyun Shik Oh, Authorized Officer, Sep. 27, 2010.
International Search Report, Korean Intellectual Property Office, Daejeon, Republic of Korea, in PCT/2009/068921, PCT copending U.S. Appl. No. 12/643,486, Hyun Shik Oh, Authorized Officer, Aug. 5, 2010.
International Search Report, Korean Intellectual Property Office, Daejeon, Republic of Korea, in PCT/2009/068922, PCT copending U.S. Appl. No. 12/643,567, Hyun Shik Oh, Authorized Officer, Oct. 20, 2010.
Kirk-Othmer Encyclopedia of Chemical Technology, Fourth Edition, vol. 18, p. 837-860, 1996, by Y. Wang.
David Braun and Alan J. Heeger, Appl. Phys. Letters 58, 1982 (1991).
International Search Report, Korean Intellectual Property Office, Daejeon, Republic of Korea, in PCT/2009/069255, PCT counterpart of the present application, Hyun Shik Oh, Authorized Officer, Aug. 13, 2010.
CRC Handbook of Chemistry and Physics, 81st Edition (2000-2001) (Book Not Included).
Appleby et al., "Polymeric Perfluoro Bis-Sulfonomides as Possible Fuel Cell Electrolytes," Journal of the Electrochemical Society, 1993, vol. 140, pp. 109-111.
Burns et al., "Printing of Polymer Thin-Film Transistors for Active-Matrix Display Applications," Journal of the Society for Information Display, 2003, vol. 11, No. 4, pp. 599-604.
Desmarteau, Novel Perfluoinated Ionomers and Ionenes, Journal of Fluorine Chemistry, 1995, vol. 72, pp. 203-208.
Feiring et al., "Aromatic Monomers with Pendant Fluoroalkylsulfonate and Sulfonimide Groups," Journal of Fluorine Chemistry, 2000, vol. 105, pp. 129-135.
Feiring et al., "Novel Aromatic Polymers with Pendant Lithium Perflouroalkylsulfonate or Sulfinimide Groups," Macromolecules, 2000, vol. 33, pp. 9262-9271.
Fluegel: Statistical Calculation and Development of Glass Properties; Measurement of the Glass Transition Temperature Tg, Alexander Fluegel http://glassproperties.com/tg/; Retrieved from Internet on May 3, 2011.
Frechet, "The Photogeneration of Acid and Base within Polymer Coatings: Approaches to Polymer Curing and Imaging," Pure and Applied Chemistry, 1992, vol. 64, pp. 1239-1248.
Gustafsson et al., Flexible Light-Emitting Diodes Made from Soluble Conducting Polymers, Nature, 1992 vol. 357, pp. 477-479.
Lee et al., Poly(thieno(3,4-b)thiophene) A New Stable Low Band Gap Conducting Polymer, Macromolecules, 2001, vol. 34, pp. 5746-5747.
Monroe et al., "Photoinitiators for Free-Radical-Initiated Photoimaging Systems," Chemical Reviews, 1993, vol. 93 (1), pp. 435-448.
O'Brien, D.F. et al., "Electrophosphorescence From a Doped Polymer Light Emitting Diode," Synthetic Metals, 2001, 116(1-3), 379-383.
Shirai et al., "Photoacid and Photobase Generators: Chemistry and Applications to Polymeric Materials," Progress in Polymer Science, 1996, vol. 21, pp. 1-45.
Sotzing et al., "Poly(thieno(3,4-b)thiophene): A p- and n-Dopable Polythiophene Exhibiting High Optical Transparency in the Semiconducting State," Macromolecules, 2002, vol. 35, pp. 7281-7286.
Sugimura et al., "Micropatterning of Alkyl- and Fluoroalkylsilane Self-Assembled Monolayers Using Vacuum Ultra-Violet Light," Langmuir, 2000, vol. 16, No. 3, pp. 885-888.
Suyama et al., "Photobase Generators: Recent Progress and Application Trend in Polymer Systems," Progress in Polymer Science, 2009, vol. 34, pp. 194-209.
Thelakkat, "Star-Shaped, Dendrimeric and Polymeric Triarylamines as Photoconductors and Hole Transport Materials for Electro-Optical Applications," Macromolecular Materials and Engineering, 2002, vol. 287, pp. 442-461.
Wu et al., "Transparent, Conductive Carbon Nanotube Films," Science, 2004, vol. 305, pp. 1273-1276.
Extended European Search Report for Application No. EP06749552.3, counterpart to U.S. Appl. No. 11/401,151; Apr. 18, 2011.
Extended European Search Report for Application No. EP07755188.5, counterpart to U.S. Appl. No. 11/444,655; Mar. 21, 2012.
International Search Report for Application No. PCT/US2006/013118, counterpart to U.S. Appl. No. 11/401,151; William Philip Fletcher III, Authorized Officer; May 28, 2008.
International Search Report for Application No. PCT/US2007/008830, counterpart to U.S. Appl. No. 11/444,655; Shanon Foley, Authorized Officer; ISA/US; Mar. 18, 2008.
International Search Report for Application No. PCT/US2007/01328, counterpart to U.S. Appl. No. 11/758,283; Georg Wolfbauer, Authorized Officer; EPO; Nov. 26, 2007.
International Search Report for Application No. PCT/US2008/063825, counterpart to U.S. Appl. No. 12/121,234; Pierre Leveant, Authorized Officer; EPO; Oct. 31, 2008.
International Search Report for Application No. PCT/US2009/044502, counterpart to U.S. Appl. No. 12/993,202; Chang Gyun Kim, Authorized Officer; KIPO; Dec. 23, 2009.

\* cited by examiner

PROCESS AND MATERIALS FOR MAKING CONTAINED LAYERS AND DEVICES MADE WITH SAME

RELATED APPLICATION DATA

This application claims priority under 35 U.S.C. §119(e) from U.S. Provisional Application No. 61/228,689 filed on Jul. 27, 2009, which is incorporated by reference herein in its entirety.

BACKGROUND INFORMATION

1. Field of the Disclosure

This disclosure relates in general to a process for making an electronic device. It further relates to the device made by the process.

2. Description of the Related Art

Electronic devices utilizing organic active materials are present in many different kinds of electronic equipment. In such devices, an organic active layer is sandwiched between two electrodes.

One type of electronic device is an organic light emitting diode (OLED). OLEDs are promising for display applications due to their high power-conversion efficiency and low processing costs. Such displays are especially promising for battery-powered, portable electronic devices, including cellphones, personal digital assistants, handheld personal computers, and DVD players. These applications call for displays with high information content, full color, and fast video rate response time in addition to low power consumption.

Current research in the production of full-color OLEDs is directed toward the development of cost effective, high throughput processes for producing color pixels. For the manufacture of monochromatic displays by liquid processing, spin-coating processes have been widely adopted (see, e.g., David Braun and Alan J. Heeger, Appl. Phys. Letters 58, 1982 (1991)). However, manufacture of full-color displays requires certain modifications to procedures used in manufacture of monochromatic displays. For example, to make a display with full-color images, each display pixel is divided into three subpixels, each emitting one of the three primary display colors, red, green, and blue. This division of full-color pixels into three subpixels has resulted in a need to modify current processes to prevent the spreading of the liquid colored materials (i.e., inks) and color mixing.

Several methods for providing ink containment are described in the literature. These are based on containment structures, surface tension discontinuities, and combinations of both. Containment structures are geometric obstacles to spreading: pixel wells, banks, etc. In order to be effective these structures must be large, comparable to the wet thickness of the deposited materials. When the emissive ink is printed into these structures it wets onto the structure surface, so thickness uniformity is reduced near the structure. Therefore the structure must be moved outside the emissive "pixel" region so the non-uniformities are not visible in operation. Due to limited space on the display (especially high-resolution displays) this reduces the available emissive area of the pixel. Practical containment structures generally have a negative impact on quality when depositing continuous layers of the charge injection and transport layers. Consequently, all the layers must be printed.

In addition, surface tension discontinuities are obtained when there are either printed or vapor deposited regions of low surface tension materials. These low surface tension materials generally must be applied before printing or coating the first organic active layer in the pixel area. Generally the use of these treatments impacts the quality when coating continuous non-emissive layers, so all the layers must be printed.

An example of a combination of two ink containment techniques is $CF_4$-plasma treatment of photoresist bank structures (pixel wells, channels). Generally, all of the active layers must be printed in the pixel areas.

All these containment methods have the drawback of precluding continuous coating. Continuous coating of one or more layers is desirable as it can result in higher yields and lower equipment cost. There exists, therefore, a need for improved processes for forming electronic devices.

SUMMARY

There is provided a process for forming a contained second layer over a first layer, said process comprising:
 forming the first layer having a first surface energy;
 treating the first layer with a priming layer;
 exposing the priming layer patternwise with radiation resulting in exposed areas and unexposed areas;
 developing the priming layer to effectively remove the priming layer from either the exposed areas or the unexposed areas resulting in a first layer having a pattern of priming layer, wherein the pattern of priming layer has a second surface energy that is higher than the first surface energy; and
 forming the second layer on the pattern of priming layer by liquid deposition on the first layer.

There is also provided a process for making an organic electronic device comprising an electrode having positioned thereover a first organic active layer and a second organic active layer, said process comprising:
 forming the first organic active layer having a first surface energy over the electrode;
 treating the first organic active layer with a priming layer;
 exposing the priming layer patternwise with radiation resulting in exposed areas and unexposed areas;
 developing the priming layer to effectively remove the priming layer from either the exposed areas or the unexposed areas resulting in a first active organic layer having a pattern of priming layer, wherein the pattern of priming layer has a second surface energy that is higher than the first surface energy; and
 forming the second organic active layer on the pattern of priming layer by liquid deposition on the first organic active layer.

There is also provided an organic electronic device comprising a first organic active layer and a second organic active layer positioned over an electrode, and further comprising a patterned priming layer between the first and second organic active layers, wherein said second organic active layer is present only in areas where the priming layer is present.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
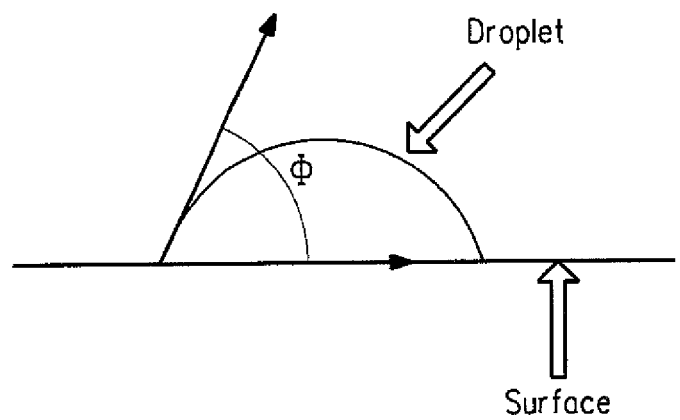
FIG. 1 includes a diagram illustrating contact angle.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

There is provided a process for forming a contained second layer over a first layer, said process comprising:
  forming the first layer having a first surface energy;
  treating the first layer with a priming layer;
  exposing the priming layer patternwise with radiation resulting in exposed areas and unexposed areas;
  developing the priming layer to effectively remove the priming layer from either the exposed areas or the unexposed areas resulting in a first layer having a pattern of priming layer, wherein the pattern of priming layer has a second surface energy that is higher than the first surface energy; and
  forming the second layer on the pattern of priming layer on the first layer.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Process, the Organic Electronic Device, and finally Examples.

1. Definitions and Clarification of Terms

Before addressing details of embodiments described below, some terms are defined or clarified.

The term "active" when referring to a layer or material, is intended to mean a layer or material that exhibits electronic or electro-radiative properties. In an electronic device, an active material electronically facilitates the operation of the device. Examples of active materials include, but are not limited to, materials which conduct, inject, transport, or block a charge, where the charge can be either an electron or a hole, and materials which emit radiation or exhibit a change in concentration of electron-hole pairs when receiving radiation. Examples of inactive materials include, but are not limited to, planarization materials, insulating materials, and environmental barrier materials.

The term "contained" when referring to a layer, is intended to mean that as the layer is printed, it does not spread significantly beyond the area where it is deposited despite a natural tendency to do so were it not contained. With "chemical containment" the layer is contained by surface energy effects. With "physical containment" the layer is contained by physical barrier structures. A layer may be contained by a combination of chemical containment and physical containment.

The terms "developing" and "development" refer to physical differentiation between areas of a material exposed to radiation and areas not exposed to radiation, and the removal of either the exposed or unexposed areas.

The term "electrode" is intended to mean a member or structure configured to transport carriers within an electronic component. For example, an electrode may be an anode, a cathode, a capacitor electrode, a gate electrode, etc. An electrode may include a part of a transistor, a capacitor, a resistor, an inductor, a diode, an electronic component, a power supply, or any combination thereof.

The term "fluorinated" when referring to an organic compound, is intended to mean that one or more of the hydrogen atoms bound to carbon in the compound have been replaced by fluorine. The term encompasses partially and fully fluorinated materials.

The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. A layer may be highly patterned or may be overall and unpatterned.

The term "liquid composition" is intended to mean a liquid medium in which a material is dissolved to form a solution, a liquid medium in which a material is dispersed to form a dispersion, or a liquid medium in which a material is suspended to form a suspension or an emulsion.

The term "liquid medium" is intended to mean a liquid material, including a pure liquid, a combination of liquids, a solution, a dispersion, a suspension, and an emulsion. Liquid medium is used regardless whether one or more solvents are present.

The term "organic electronic device" is intended to mean a device including one or more organic semiconductor layers or materials. An organic electronic device includes, but is not limited to: (1) a device that converts electrical energy into radiation (e.g., a light-emitting diode, light emitting diode display, diode laser, or lighting panel), (2) a device that detects a signal using an electronic process (e.g., a photodetector, a photoconductive cell, a photoresistor, a photoswitch, a phototransistor, a phototube, an infrared ("IR") detector, or a biosensors), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

The term "photocurable" is intended to refer to a radiation-sensitive composition or layer which becomes better adhered to a surface or more difficult to remove from a surface when exposed to radiation.

The terms "radiating" and "radiation" refer to adding energy in any form, including heat in any form, the entire electromagnetic spectrum, or subatomic particles, regardless of whether such radiation is in the form of rays, waves, or particles.

The term "radiation-sensitive" when referring to a material, is intended to mean that exposure to radiation results in a change of at least one chemical, physical, or electrical property of the material.

The term "surface energy" is the energy required to create a unit area of a surface from a material. A characteristic of surface energy is that liquid materials with a given surface energy will not wet surfaces with a sufficiently lower surface energy. A layer with a low surface energy is more difficult to wet than a layer with a higher surface energy.

As used herein, the term "over" does not necessarily mean that a layer, member, or structure is immediately next to or in contact with another layer, member, or structure. There may be additional, intervening layers, members or structures.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Process

In the process provided herein, a first layer is formed, a priming layer is formed over the first layer, the priming layer is exposed to radiation in a pattern, the priming layer is developed to effectively remove the priming layer from either the exposed areas or the unexposed areas, resulting in a first layer having a patterned priming layer thereon. By the terms "effectively remove" and "effective removal" it is meant that the priming layer is essentially completely removed in either the exposed or unexposed areas. The priming layer may also be partially removed in the other areas, so that the remaining pattern of priming layer may be thinner than the original priming layer. The pattern of priming layer has a surface energy that is higher than the surface energy of the first layer. A second layer is formed by liquid deposition over and on the pattern of priming layer on the first layer.

One way to determine the relative surface energies, is to compare the contact angle of a given liquid on the first organic layer to the contact angle of the same liquid on the priming layer after exposure and development (hereinafter referred to as the "developed priming layer"). As used herein, the term "contact angle" is intended to mean the angle φ shown in FIG. 1. For a droplet of liquid medium, angle φ is defined by the intersection of the plane of the surface and a line from the outer edge of the droplet to the surface. Furthermore, angle φ is measured after the droplet has reached an equilibrium position on the surface after being applied, i.e. "static contact angle". The contact angle increases with decreasing surface energy. A variety of manufacturers make equipment capable of measuring contact angles.

In some embodiments, the first layer has a contact angle with anisole of greater than 40° C.; in some embodiments, greater than 50°; in some embodiments, greater than 60°; in some embodiments, greater than 70°. In some embodiments, the developed priming layer, has a contact angle with anisole of less than 30°; in some embodiments, less than 20°; in some embodiments, less than 10°. In some embodiments, for a given solvent, the contact angle with the developed priming layer is at least 20° lower than the contact angle with the first layer; In some embodiments, for a given solvent, the contact angle with the developed priming layer is at least 30° lower than the contact angle with the first layer; In some embodiments, for a given solvent, the contact angle with the developed priming layer is at least 40° lower than the contact angle with the first layer.

In one embodiment, the first layer is an organic layer deposited on a substrate. The first layer can be patterned or unpatterned. In one embodiment, the first layer is an organic active layer in an electronic device. In one embodiment, the first layer comprises a fluorinated material.

The first layer can be formed by any deposition technique, including vapor deposition techniques, liquid deposition techniques, and thermal transfer techniques. In one embodiment, the first layer is deposited by a liquid deposition technique, followed by drying. In this case, a first material is dissolved or dispersed in a liquid medium. The liquid deposition method may be continuous or discontinuous. Continuous liquid deposition techniques, include but are not limited to, spin coating, roll coating, curtain coating, dip coating, slot-die coating, spray coating, and continuous nozzle coating. Discontinuous liquid deposition techniques include, but are not limited to, ink jet printing, gravure printing, flexographic printing and screen printing. In one embodiment, the first layer is deposited by a continuous liquid deposition technique. The drying step can take place at room temperature or at elevated temperatures, so long as the first material and any underlying materials are not damaged.

The first layer is then treated with a priming layer. By this, it is meant that the priming material is applied over and directly in contact with the first layer to form the priming layer. The priming layer comprises a composition which, when exposed to radiation reacts to form a material that is either more or less removable from the underlying first layer, relative to unexposed priming material. This change must be enough to allow physical differentiation of the exposed and non-exposed areas and development.

In one embodiment, the priming layer comprises a radiation-hardenable composition. In this case, when exposed to radiation, the priming layer can become less soluble or dispersable in a liquid medium, less tacky, less soft, less flowable, less liftable, or less absorbable. Other physical properties may also be affected.

In one embodiment, the priming layer consists essentially of one or more radiation-sensitive materials. In one embodiment, the priming layer consists essentially of a material which, when exposed to radiation, hardens, or becomes less soluble, swellable, or dispersible in a liquid medium, or becomes less tacky or absorbable. In one embodiment, the priming layer consists essentially of a material having radiation polymerizable groups. Examples of such groups include, but are not limited to olefins, acrylates, methacrylates and vinyl ethers. In one embodiment, the priming material has two or more polymerizable groups which can result in crosslinking.

In one embodiment, the priming layer consists essentially of at least one reactive material and at least one radiation-sensitive material. The radiation-sensitive material, when exposed to radiation, generates an active species that initiates the reaction of the reactive material. Examples of radiation-sensitive materials include, but are not limited to, those that generate free radicals, acids, or combinations thereof.

In one embodiment, the reactive material is polymerizable or crosslinkable. The material polymerization or crosslinking reaction is initiated or catalyzed by the active species. In one embodiment, the reactive material is an ethylenically unsaturated compound and the radiation-sensitive material generates free radicals. Ethylenically unsaturated compounds include, but are not limited to, acrylates, methacrylates, vinyl compounds, and combinations thereof. Any of the known classes of radiation-sensitive materials that generate free radicals can be used. Examples of radiation-sensitive materials which generate free radicals include, but are not limited to, quinones, benzophenones, benzoin ethers, aryl ketones, peroxides, biimidazoles, benzyl dimethyl ketal, hydroxyl alkyl phenyl acetophone, dialkoxy actophenone, trimethylbenzoyl phosphine oxide derivatives, aminoketones, benzoyl cyclohexanol, methyl thio phenyl morpholino ketones, morpholino phenyl amino ketones, alpha halogennoacetophenones, oxysulfonyl ketones, sulfonyl ketones, oxysulfonyl ketones, sulfonyl ketones, benzoyl oxime esters, thioxanthrones, camphorquinones, ketocoumarins, and Michler's ketone. Alternatively, the radiation sensitive material may be a mixture of compounds, one of which provides the free radicals when caused to do so by a sensitizer activated by radiation. In one embodiment, the radiation sensitive material is sensitive to visible or ultraviolet radiation.

The radiation-sensitive material is generally present in amounts from 0.001% to 10.0% based on the total weight of the priming layer.

In one embodiment, the reactive material can undergo polymerization initiated by acid, and the radiation-sensitive material generates acid. Examples of such reactive materials include, but are not limited to, epoxies. Examples of radiation-sensitive materials which generate acid, include, but are not limited to, sulfonium and iodonium salts, such as diphenyliodonium hexafluorophosphate.

In one embodiment, the priming layer comprises a radiation-softenable composition. In this case, when exposed to radiation, the priming layer can become more soluble or dispersable in a liquid medium, more tacky, more soft, more flowable, more liftable, or more absorbable. Other physical properties may also be affected.

In one embodiment, the priming layer consists essentially of a material which, when exposed to radiation, softens, or becomes more soluble, swellable, or dispersible in a liquid medium, or becomes more tacky or absorbable.

In one example of a radiation-softenable composition, the reactive material is a phenolic resin and the radiation-sensitive material is a diazonaphthoquinone.

In one example of a radiation-softenable composition, the priming layer consists essentially of at least one polymer which undergoes backbone degradation when exposed to deep UV radiation, having a wavelength in the range of 200-300 nm. Examples of polymers undergoing such degradation include, but are not limited to, polyacrylates, polymethacrylates, polyketones, polysulfones, copolymers thereof, and mixtures thereof.

Other radiation-sensitive systems that are known in the art can be used as well.

In one embodiment, the priming layer reacts with the underlying area when exposed to radiation. The exact mechanism of this reaction will depend on the materials used. After exposure to radiation, the priming layer is effectively removed in the unexposed areas by a suitable development treatment. In some embodiments, the priming layer is removed only in the unexposed areas. In some embodiments, the priming layer is partially removed in the exposed areas as well, leaving a thinner layer in those areas. In some embodiments, the priming layer that remains in the exposed areas is less than 50 Å in thickness. In some embodiments, the priming layer that remains in the exposed areas is essentially a monolayer in thickness.

In some embodiments, the priming material is deuterated. The term "deuterated" is intended to mean that at least one H has been replaced by D. The term "deuterated analog" refers to a structural analog of a compound or group in which one or more available hydrogens have been replaced with deuterium. In a deuterated compound or deuterated analog, the deuterium is present in at least 100 times the natural abundance level. In some embodiments, the priming material is at least 10% deuterated. By "% deuterated" or "% deuteration" is meant the ratio of deuterons to the sum of protons plus deuterons, expressed as a percentage. In some embodiments, the priming material is at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

Deuterated priming materials can be less susceptible to degradation by holes, electrons, exitons, or a combination thereof. Deuteration can potentially inhibit degradation of the priming layer during device operation, which in turn can lead to improved device lifetime. In general, this improvement is accomplished without sacrificing other device properties. Furthermore, the deuterated compounds frequently have greater air tolerance than the non-deuterated analogs. This can result in greater processing tolerance both for the preparation and purification of the materials and in the formation of electronic devices using the materials.

The priming layer can be applied by any known deposition process. In one embodiment, the priming layer is applied without adding it to a solvent. In one embodiment, the priming layer is applied by vapor deposition.

In one embodiment, the priming layer is applied by a condensation process. If the priming layer is applied by condensation from the vapor phase, and the surface layer temperature is too high during vapor condensation, the priming layer can migrate into the pores or free volume of an organic substrate surface. In some embodiments, the organic substrate is maintained at a temperature below the glass transition temperature or the melting temperature of the substrate materials. The temperature can be maintained by any known techniques, such as placing the first layer on a surface which is cooled with flowing liquids or gases.

In one embodiment, the priming layer is applied to a temporary support prior to the condensation step, to form a uniform coating of priming layer. This can be accomplished by any deposition method, including liquid deposition, vapor deposition, and thermal transfer. In one embodiment, the priming layer is deposited on the temporary support by a continuous liquid deposition technique. The choice of liquid medium for depositing the priming layer will depend on the exact nature of the priming layer itself. In one embodiment, the material is deposited by spin coating. The coated temporary support is then used as the source for heating to form the vapor for the condensation step.

Application of the priming layer can be accomplished utilizing either continuous or batch processes. For instance, in a batch process, one or more devices would be coated simultaneously with the priming layer and then exposed simultaneously to a source of radiation. In a continuous process, devices transported on a belt or other conveyer device would pass a station when they are sequentially coated with priming layer and then continue past a station where they are sequentially exposed to a source of radiation. Portions of the process may be continuous while other portions of the process may be batch.

In one embodiment, the priming material is a liquid at room temperature and is applied by liquid deposition over the first layer. The liquid priming material may be film-forming or it may be absorbed or adsorbed onto the surface of the first layer. In one embodiment, the liquid priming material is cooled to a temperature below its melting point in order to form a second layer over the first layer. In one embodiment, the priming material is not a liquid at room temperature and is heated to a temperature above its melting point, deposited on the first layer, and cooled to room temperature to form a second layer over the first layer. For the liquid deposition, any of the methods described above may be used.

In one embodiment, the priming layer is deposited from a second liquid composition. The liquid deposition method can be continuous or discontinuous, as described above. In one embodiment, the priming liquid composition is deposited using a continuous liquid deposition method. The choice of liquid medium for depositing the priming layer will depend on the exact nature of the priming material itself.

After the priming layer is formed, it is exposed to radiation. The type of radiation used will depend upon the sensitivity of the priming layer as discussed above. The exposure is patternwise. As used herein, the term "patternwise" indicates that only selected portions of a material or layer are exposed. Patternwise exposure can be achieved using any known imaging technique. In one embodiment, the pattern is achieved by exposing through a mask. In one embodiment, the pattern is achieved by exposing only select portions with a rastered laser. The time of exposure can range from seconds to minutes, depending upon the specific chemistry of the priming layer used. When lasers are used, much shorter exposure times are used for each individual area, depending upon the power of the laser. The exposure step can be carried out in air or in an inert atmosphere, depending upon the sensitivity of the materials.

In one embodiment, the radiation is selected from the group consisting of ultra-violet radiation (10-390 nm), visible radiation (390-770 nm), infrared radiation (770-$10^6$ nm), and combinations thereof, including simultaneous and serial treatments. In one embodiment, the radiation is selected from visible radiation and ultraviolet radiation. In one embodiment, the radiation has a wavelength in the range of 300 to 450 nm. In one embodiment, the radiation is deep UV (200-300 nm). In another embodiment, the ultraviolet radiation has a wavelength between 300 and 400 nm. In another embodiment, the radiation has a wavelength in the range of 400 to 450 nm. In one embodiment, the radiation is thermal radiation. In one embodiment, the exposure to radiation is carried out by heating. The temperature and duration for the heating step is such that at least one physical property of the priming layer is changed, without damaging any underlying layers of the light-emitting areas. In one embodiment, the heating temperature is less than 250° C. In one embodiment, the heating temperature is less than 150° C.

After patternwise exposure to radiation, the priming layer is developed. Development can be accomplished by any known technique. Such techniques have been used extensively in the photoresist and printing art. Examples of development techniques include, but are not limited to, application of heat (evaporation), treatment with a liquid medium (washing), treatment with an absorbant material (blotting), treatment with a tacky material, and the like. The development step results in effective removal of the priming layer in either the exposed or unexposed areas. The priming layer then remains in either the unexposed or exposed areas, respectively. The priming layer may also be partially removed in the unexposed or exposed areas, but enough must remain in order for there to be a wettability difference between the exposed and unexposed areas. For example, the priming layer may be effectively removed in the unexposed areas and a part of the thickness removed in the exposed areas. In some embodiments, the development step results in effective removal of the priming layer in the unexposed areas.

In one embodiment, the exposure of the priming layer to radiation results in a change in the solubility or dispersibility of the priming layer in solvents. In this case, development can be accomplished by a wet development treatment. The treatment usually involves washing with a solvent which dissolves, disperses or lifts off one type of area. In one embodiment, the patternwise exposure to radiation results in insolubilization of the exposed areas of the priming layer, and treatment with solvent results in removal of the unexposed areas of the priming layer.

In one embodiment, the exposure of the priming layer to radiation results in a reaction which changes the volatility of the priming layer in exposed areas. In this case, development can be accomplished by a thermal development treatment. The treatment involves heating to a temperature above the volatilization or sublimation temperature of the more volatile material and below the temperature at which the material is thermally reactive. For example, for a polymerizable monomer, the material would be heated at a temperature above the sublimation temperature and below the thermal polymerization temperature. It will be understood that priming materials which have a temperature of thermal reactivity that is close to or below the volatilization temperature, may not be able to be developed in this manner.

In one embodiment, the exposure of the priming layer to radiation results in a change in the temperature at which the material melts, softens or flows. In this case, development can be accomplished by a dry development treatment. A dry development treatment can include contacting an outermost surface of the element with an absorbent surface to absorb or wick away the softer portions. This dry development can be carried out at an elevated temperature, so long as it does not further affect the properties of the remaining areas.

The development step results areas of priming layer that remain and areas in which the underlying first layer is uncovered. In some embodiments, the difference in contact angle with a given solvent for the patterned priming layer and uncovered areas is at least 20°; in some embodiments, at least 30°; in some embodiments, at least 40°.

The second layer is then applied by liquid deposition over and on the developed pattern of priming material on the first layer. In one embodiment, the second layer is a second organic active layer in an electronic device.

The second layer can be applied by any liquid deposition technique. A liquid composition comprising a second material dissolved or dispersed in a liquid medium, is applied over the pattern of developed priming layer, and dried to form the second layer. The liquid composition is chosen to have a surface energy that is greater than the surface energy of the first layer, but approximately the same as or less than the surface energy of the developed priming layer. Thus, the liquid composition will wet the developed priming layer, but will be repelled from the first layer in the areas where the priming layer has been removed. The liquid may spread onto the treated first layer area, but it will de-wet and be contained to the pattern of the developed priming layer. In some embodiments, the second layer is applied by a continuous liquid deposition technique, as described above.

In one embodiment of the process provided herein, the first and second layers are organic active layers. The first organic active layer is formed over a first electrode, a priming layer is formed over the first organic active layer, exposed to radiation and developed to form a pattern of developed priming layer, and the second organic active layer is formed over the developed priming layer on the first organic active layer, such that it is present only over and in the same pattern as the priming layer.

In one embodiment, the first organic active layer is formed by liquid deposition of a first liquid composition comprising the first organic active material and a first liquid medium. The liquid composition is deposited over the first electrode layer, and then dried to form a layer. In one embodiment, the first organic active layer is formed by a continuous liquid deposition method. Such methods may result in higher yields and lower equipment costs.

In one embodiment, the priming is formed by liquid deposition of a second liquid composition comprising the priming material in a second liquid medium. The second liquid medium can be the same as or different from the first liquid medium, so long as it does not damage the first layer. The liquid deposition method can be continuous or discontinuous, as described above. In one embodiment, the priming liquid composition is deposited using a continuous liquid deposition method.

In one embodiment, the second organic active layer is formed by liquid deposition of a third liquid composition comprising the second organic active material and a third liquid medium. The third liquid medium can be the same as or different from the first and second liquid media, so long as it does not damage the first layer or the developed priming layer. In some embodiments, the second organic active layer is formed by printing.

In some embodiments, a third layer is applied over the second layer, such that it is present only over and in the same pattern as the second layer. The third layer can be applied by any of the processes described above for the second layer. In some embodiments, the third layer is applied by a liquid deposition technique. In some embodiments, the third organic active layer is formed by a printing method selected from the group consisting of ink jet printing and continuous nozzle printing.

In some embodiments, the priming material is the same as the second organic active material.

The thickness of the developed priming layer can depend upon the ultimate end use of the material. In some embodiments, the developed priming layer is less than 100 Å in thickness. In some embodiments, the thickness is in the range of 1-50 Å; in some embodiments 5-30 Å.

3. Organic Electronic Device

The process will be further described in terms of its application in an electronic device, although it is not limited to such application.

Figure 2:
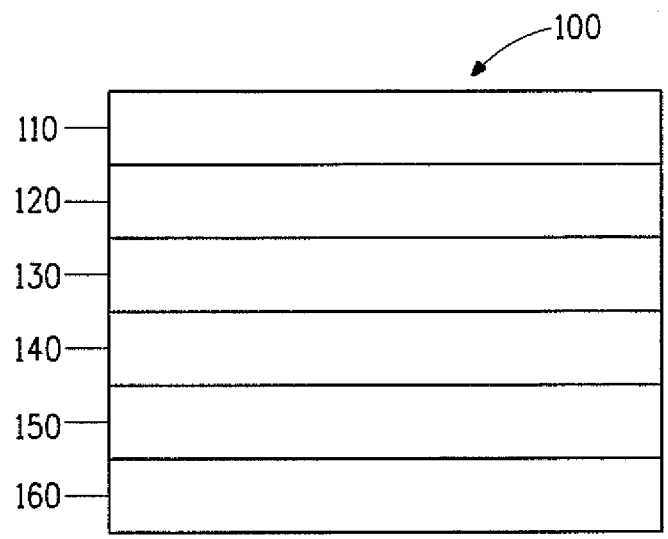
FIG. 2 includes an illustration of an organic electronic device.

FIG. 2 is an exemplary electronic device, an organic light-emitting diode (OLED) display that includes at least two organic active layers positioned between two electrical contact layers. The electronic device 100 includes one or more layers 120 and 130 to facilitate the injection of holes from the anode layer 110 into the emissive layer 140. In general, when two layers are present, the layer 120 adjacent the anode is called the hole injection layer, sometimes called a buffer layer. The layer 130 adjacent to the emissive layer is called the hole transport layer. An optional electron transport layer 150 is located between the emissive layer 140 and a cathode layer 160. The organic layers 120 through 150 are individually and collectively referred to an the organic active layers of the device. Depending on the application of the device 100, the emissive layer 140 can be a light-emitting layer that is activated by an applied voltage (such as in a light-emitting diode or light-emitting electrochemical cell), a layer of material that responds to radiant energy and generates a signal with or without an applied bias voltage (such as in a photodetector). The device is not limited with respect to system, driving method, and utility mode. The priming layer is not shown in this diagram.

For multicolor devices, the emissive layer 140 is made up different areas of at least three different colors. The areas of different color can be formed by printing the separate colored areas. Alternatively, it can be accomplished by forming an overall layer and doping different areas of the layer with emissive materials with different colors. Such a process has been described in, for example, published U.S. patent application 2004-0094768.

In some embodiments, the new process described herein can be used for any successive pairs of organic layers in the device, where the second layer is to be contained in a specific area. The process for making an organic electronic device comprising an electrode having positioned thereover a first organic active layer and a second organic active layer, comprises:

forming the first organic active layer having a first surface energy over the electrode;

treating the first organic active layer with a priming layer;

exposing the priming layer patternwise with radiation resulting in exposed areas and unexposed areas;

developing the priming layer to remove the priming layer from either the exposed areas or the unexposed areas resulting in a first active organic layer having a pattern of priming layer, wherein the pattern of priming layer has a second surface energy that is higher than the first surface energy; and forming the second organic active layer by liquid deposition on the pattern of priming layer on the first organic active layer.

In one embodiment of the new process, the second organic active layer is the emissive layer 140, and the first organic active layer is the device layer applied just before layer 140. In many cases the device is constructed beginning with the anode layer. When the hole transport layer 130 is present, the priming layer would be applied to layer 130 and developed prior to applying the emissive layer 140. When layer 130 was not present, the priming layer would be applied to layer 120. In the case where the device was constructed beginning with the cathode, the priming layer would be applied to the electron transport layer 150 prior to applying the emissive layer 140.

In one embodiment of the new process, the first organic active layer is the hole injection layer 120 and the second organic active layer is the hole transport layer 130. In the embodiment where the device is constructed beginning with the anode layer, the priming layer is applied to hole injection layer 120 and developed prior to applying the hole transport layer 130. In one embodiment, the hole injection layer comprises a fluorinated material. In one embodiment, the hole injection layer comprises a conductive polymer doped with a fluorinated acid polymer. In one embodiment, the hole injection layer consists essentially of a conductive polymer doped with a fluorinated acid polymer. In some embodiments, the priming layer consists essentially of hole transport material. In one embodiment, the priming layer consists essentially of the same hole transport material as the hole transport layer.

The layers in the device can be made of any materials which are known to be useful in such layers. The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes compared to the cathode layer 160. The anode can include materials containing a metal, mixed metal, alloy, metal oxide or mixed oxide. Suitable materials include the mixed oxides of the Group 2 elements (i.e., Be, Mg, Ca, Sr, Ba), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), aluminum-tin-oxide, aluminum-zinc-oxide, gold, silver, copper, and nickel. The anode may also comprise an organic material such as polyaniline, polythiophene, or polypyrrole.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

Usually, the anode layer 110 is patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 typically is formed into substantially parallel strips having lengths that extend in substantially the same direction.

The hole injection layer 120 functions to facilitate injection of holes into the emissive layer and to planarize the anode surface to prevent shorts in the device. Hole injection materials may be polymers, oligomers, or small molecules, and may be in the form of solutions, dispersions, suspensions, emulsions, colloidal mixtures, or other compositions.

The hole injection layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The hole injection layer 120 can comprise charge transfer compounds, and the like, such as copper phthalocyanine and the tetrathiafulvalene-tetracyano-quinodimethane system (TTF-TCNQ). In one embodiment, the hole injection layer 120 is made from a dispersion of a conducting polymer and a colloid-forming polymeric acid. Such materials have been described in, for example, published U.S. patent applications US 2004/0102577, US 2004/0127637, US 2005/0205860, and published PCT application WO 2009/018009.

The hole injection layer 120 can be applied by any deposition technique. In one embodiment, the hole injection layer is applied by a solution deposition method, as described above. In one embodiment, the hole injection layer is applied by a continuous solution deposition method.

Layer 130 comprises hole transport material. Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting small molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MT-DATA); N,N'-diphenyl-N,N'-bis(3-methylphenyl)-[1,1'-biphenyl]-4,4'-diamine (TPD); 4,4'-bis(carbazol-9-yl) biphenyl (CBP); 1,3-bis(carbazol-9-yl)benzene (mCP); 1,1-bis[(di-4-tolylamino) phenyl]cyclohexane (TAPC); N,N'-bis (4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl] (4-methylphenyl)methane (MPMP); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis (naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate.

In some embodiments, the hole transport layer comprises a hole transport polymer. In some embodiments, the hole transport polymer is a distyrylaryl compound. In some embodiments, the aryl group is has two or more fused aromatic rings. In some embodiments, the aryl group is an acene. The term "acene" as used herein refers to a hydrocarbon parent component that contains two or more ortho-fused benzene rings in a straight linear arrangement.

In some embodiments, the hole transport polymer is an arylamine polymer. In some embodiments, it is a copolymer of fluorene and arylamine monomers.

In some embodiments, the polymer has crosslinkable groups. In some embodiments, crosslinking can be accomplished by a heat treatment and/or exposure to UV or visible radiation. Examples of crosslinkable groups include, but are not limited to vinyl, acrylate, perfluorovinylether, 1-benzo-3, 4-cyclobutane, siloxane, and methyl esters. Crosslinkable polymers can have advantages in the fabrication of solution-process OLEDs. The application of a soluble polymeric material to form a layer which can be converted into an insoluble film subsequent to deposition, can allow for the fabrication of multilayer solution-processed OLED devices free of layer dissolution problems.

Examples of crosslinkable polymers can be found in, for example, published US patent application 2005/0184287 and published PCT application WO 2005/052027.

In some embodiments, the hole transport layer comprises a polymer which is a copolymer of 9,9-dialkylfluorene and triphenylamine. In some embodiments, the polymer is a copolymer of 9,9-dialkylfluorene and 4,4'-bis(diphenylamino)biphenyl. In some embodiments, the polymer is a copolymer of 9,9-dialkylfluorene and TPB. In some embodiments, the polymer is a copolymer of 9,9-dialkylfluorene and NPB. In some embodiments, the copolymer is made from a third comonomer selected from (vinylphenyl)diphenylamine and 9,9-distyrylfluorene or 9,9-di(vinylbenzyl)fluorene. In some embodiments, the hole transport layer comprises a material comprising triarylamines having conjugated moieties which are connected in a non-planar configuration. Such materials can be monomeric or polymeric. Examples of such materials have been described in, for example, published PCT application WO 2009/067419.

In some embodiments, the hole transport layer is doped with a p-dopant, such as tetrafluorotetracyanoquinodimethane and perylene-3,4,9,10-tetracarboxylic-3,4,9,10-dianhydride.

The hole transport layer 130 can be applied by any deposition technique. In one embodiment, the hole transport layer is applied by a solution deposition method, as described above. In one embodiment, the hole transport layer is applied by a continuous solution deposition method.

Depending upon the application of the device, the emissive layer 140 can be a light-emitting layer that is activated by an applied voltage (such as in a light-emitting diode or light-emitting electrochemical cell), a layer of material that responds to radiant energy and generates a signal with or without an applied bias voltage (such as in a photodetector). In one embodiment, the photoactive material is an organic electroluminescent ("EL") material. Any EL material can be used in the devices, including, but not limited to, small molecule organic fluorescent compounds, fluorescent and phosphorescent metal complexes, conjugated polymers, and mixtures thereof. Examples of fluorescent compounds include, but are not limited to, chrysenes, pyrenes, perylenes, rubrenes, coumarins, anthracenes, thiadiazoles, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. In some cases the small molecule fluorescent or organometallic materials are deposited as a dopant with a host material to improve processing and/or electronic properties. Examples of conjugated polymers include, but are not limited to poly(phenylenevinylenes), polyfluorenes, poly(spirobifluorenes), polythiophenes, poly(p-phenylenes), copolymers thereof, and mixtures thereof.

The emissive layer 140 can be applied by any deposition technique. In one embodiment, the emissive layer is applied by a solution deposition method, as described above. In one embodiment, the emissive layer is applied by a continuous solution deposition method.

Optional layer 150 can function both to facilitate electron transport, and also serve as a buffer layer or confinement layer to prevent quenching of the exciton at layer interfaces. Preferably, this layer promotes electron mobility and reduces exciton quenching. Examples of electron transport materials which can be used in the optional electron transport layer 150, include metal chelated oxinoid compounds, including metal quinolate derivatives such as tris(8-hydroxyquinolato)aluminum (AlQ), bis(2-methyl-8-quinolinolato)(p-phenylphenolato) aluminum (BAlq), tetrakis-(8-hydroxyquinolato) hafnium (HfQ) and tetrakis-(8-hydroxyquinolato)zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); and mixtures thereof. In some embodiments, the electron transport layer further comprises an n-dopant. N-dopant materials are well known. The n-dopants include, but are not limited to, Group 1 and 2 metals; Group 1 and 2 metal salts, such as LiF, CsF, and $Cs_2CO_3$; Group 1 and 2 metal organic compounds, such as Li quinolate; and molecular n-dopants, such as leuco dyes, metal complexes, such as $W_2(hpp)_4$ where hpp=1,3,4,6,7,8-hexahydro-2H-pyrimido-[1,2-a]-pyrimidine and cobaltocene, tetrathianaphthacene, bis(ethylenedithio)tetrathiafulvalene, heterocyclic radicals or diradicals, and the dimers, oligomers, polymers, dispiro compounds and polycycles of heterocyclic radical or diradicals.

The electron injection layer 150 is usually formed by a chemical or physical vapor deposition process.

The cathode 160, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used. Li-containing organometallic compounds, LiF, $Li_2O$, Cs-containing organometallic compounds, CsF, $Cs_2O$, and $Cs_2CO_3$ can also be deposited between the organic layer and the cathode layer to lower the operating voltage. This layer may be referred to as an electron injection layer.

The cathode layer 160 is usually formed by a chemical or physical vapor deposition process.

In some embodiments, additional layers(s) may be present within organic electronic devices.

It is understood that each functional layer can be made up of more than one layer.

In one embodiment, the different layers have the following range of thicknesses: anode 110, 100-5000 Å, in one embodiment 100-2000 Å; hole injection layer 120, 50-2500 Å, in one embodiment 200-1000 Å; hole transport layer 130, 50-2500 Å, in one embodiment 200-1000 Å; emissive layer 140, 10-2000 Å, in one embodiment 100-1000 Å; electron transport layer 150, 50-2000 Å, in one embodiment 100-1000 Å; cathode 160, 200-10000 Å, in one embodiment 300-5000 Å. The desired ratio of layer thicknesses will depend on the exact nature of the materials used.

In some embodiments, there is provided an organic electronic device comprising a first organic active layer and a second organic active layer positioned over an electrode, and further comprising a patterned priming layer between the first and second organic active layers, wherein said second organic active layer is present only in areas where the priming layer is present. In some embodiments, the first organic active layer comprises a conductive polymer and a fluorinated acid polymer. In some embodiments, the second organic active layer comprises hole transport material. In some embodiments, the first organic active layer comprises a conductive polymer doped with a fluorinated acid polymer and the second organic active layer consists essentially of hole transport material.

In some embodiments, there is provided a process for making an organic electronic device comprising an anode having thereon a hole injection layer and a hole transport layer, said process comprising:
  forming the hole injection layer over the anode, said hole injection layer comprising a fluorinated material and having a first surface energy;
  forming a priming layer directly on the hole injection layer;
  exposing the priming layer patternwise with radiation resulting in exposed areas and unexposed areas;
  developing the priming layer to effectively remove the priming layer from either the exposed areas or the unexposed areas resulting in a pattern of developed priming layer on the hole injection layer, said developed priming layer having a second surface energy that is higher than the first surface energy; and
  forming a hole transport layer by liquid deposition on the developed pattern of priming layer.

Figure 3:
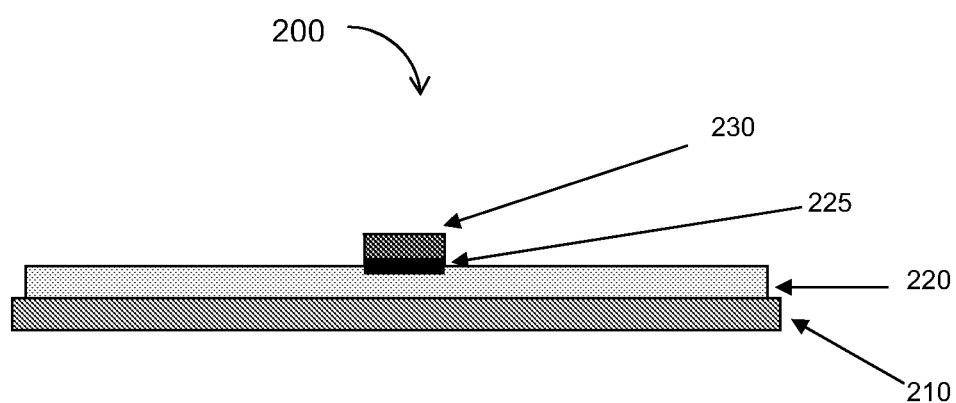
FIG. 3 includes an illustration of part of an organic electronic device having a priming layer.

This is shown schematically in FIG. 3. Device 200 has an anode 210 on a substrate (not shown). On the anode is hole injection layer 220. The developed priming layer is shown as 225. The surface energy of the hole injection layer 220 is less than the surface energy of the priming layer 225. When the hole transport layer 230 is deposited over the priming layer and hole injection layer, it does not wet the low energy surface of the hole injection layer and remains only over the pattern of the priming layer.

In some embodiments, there is provided a process for making an organic electronic device comprising an anode having thereon a hole injection layer and a hole transport layer, said process comprising:
  forming the hole injection layer over the anode, said hole injection layer comprising a conductive polymer and a fluorinated acid polymer and having a first surface energy;
  forming a priming layer directly on the hole injection layer;
  exposing the priming layer patternwise with radiation resulting in exposed areas and unexposed areas;
  developing the priming layer to effectively remove the priming layer from the unexposed areas resulting in a pattern of developed priming layer on the hole injection layer, said developed priming layer having a second surface energy that is higher than the first surface energy; and
  forming a hole transport layer by liquid deposition on the developed pattern of priming layer.

In some embodiments, the hole injection layer comprises a conductive polymer doped with a fluorinated acid polymer. In some embodiments, the hole injection layer consists essentially of a conductive polymer doped with a fluorinated acid polymer. In some embodiments, the hole injection layer consists essentially of a conductive polymer doped with a fluorinated acid polymer and inorganic nanoparticles. In some embodiments, the inorganic nanoparticles are selected from the group consisting of silicon oxide, titanium oxides, zirconium oxide, molybdenum trioxide, vanadium oxide, aluminum oxide, zinc oxide, samarium oxide, yttrium oxide, cesium oxide, cupric oxide, stannic oxide, antimony oxide, and combinations thereof. Such materials have been described in, for example, published U.S. patent applications US 2004/0102577, US 2004/0127637, US 2005/0205860, and published PCT application WO 2009/018009.

In some embodiments, the priming layer comprises a hole transport material. In some embodiments, the priming layer comprises a material selected from the group consisting of triarylamines, carbazoles, fluorenes, polymers thereof, copolymers thereof, deuterated analogs thereof, and combinations thereof. In some embodiments, the priming layer comprises a material selected from the group consisting of polymeric triarylamines, polycarbazoles, polyfluorenes, polymeric triarylamines having conjugated moieties which are connected in a non-planar configuration, copolymers of fluorene and triarylamine, deuterated analogs thereof, and combinations thereof. In some embodiments, the polymeric materials are crosslinkable. In some embodiments, the priming layer comprises an electron transport material. In some embodiments, the priming layer comprises a metal chelated oxinoid compound. In some embodiments, the priming layer comprises a metal quinolate derivative. In some embodiments, the priming layer comprises a material selected from the group consisting of tris(8-hydroxyquinolato)aluminum, bis(2-methyl-8-quinolinolato)(p-phenylphenolato) aluminum, tetrakis-(8-hydroxyquinolato)hafnium, and tetrakis-(8-hydroxyquinolato)zirconium. In some embodiments, the priming layer consists essentially of a material selected from the group consisting of polymeric triarylamines, polycarbazoles, polyfluorenes, copolymers thereof, and metal quinolates.

In some embodiments, the hole injection layer comprises a conductive polymer doped with a fluorinated acid polymer and the priming layer consists essentially of a hole transport material. In some embodiments, the hole transport material is a triarylamine polymer. Such polymers have been described in, for example, published PCT applications WO 2008/024378, WO 2008/024379, and WO 2009/067419. In some embodiments, the priming material is selected from the group consisting of polymeric triarylamines having conjugated moieties which are connected in a non-planar configuration, compounds having at least one fluorene moiety and at least two triarylamine moieties, and deuterated analogs thereof. In some embodiments, the polymeric triarylamines have Formula I, Formula II, or Formula III:

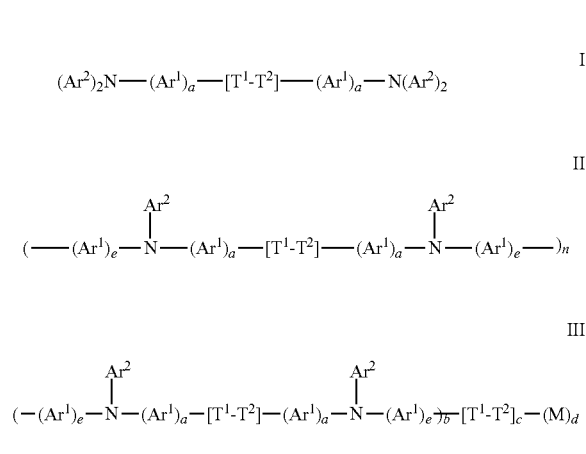

wherein:
Ar$^1$ is the same or different at each occurrence and is selected from the group consisting of phenylene, substituted phenylene, naphthylene, and substituted naphthylene;
Ar$^2$ is the same or different at each occurrence and is an aryl group;
M is the same or different at each occurrence and is a conjugated moiety;
T$^1$ and T$^2$ are independently the same or different at each occurrence and are conjugated moieties;
a is the same or different at each occurrence and is an integer from 1 to 6;
b, c, and d are mole fractions such that b+c+d=1.0, with the proviso that c is not zero, and at least one of b and d is not zero, and when b is zero, M comprises at least two triarylamine units;
e is the same or different at each occurrence and is an integer from 1 to 6; and
n is an integer greater than 1.

In some embodiments, the hole transport layer is selected from the group consisting of triarylamines, carbazoles, polymeric analogs thereof, and combinations thereof. In some embodiments, the hole transport layer is selected from the group consisting of polymeric triarylamines, polymeric triarylamines having conjugated moieties which are connected in a non-planar configuration, and copolymers of fluorene and triarylamines.

In some embodiments, the process further comprises forming an emissive layer by liquid deposition on the hole transport layer. In some embodiments, the emissive layer comprises a photoactive dopant and one or more host materials. In some embodiments, the emissive layer is formed by a liquid deposition technique selected from the group consisting of ink jet printing and continuous nozzle printing.

EXAMPLES

The concepts described herein will be further described in the following examples, which do not limit the scope of the invention described in the claims.

In the examples, the following priming materials were used:

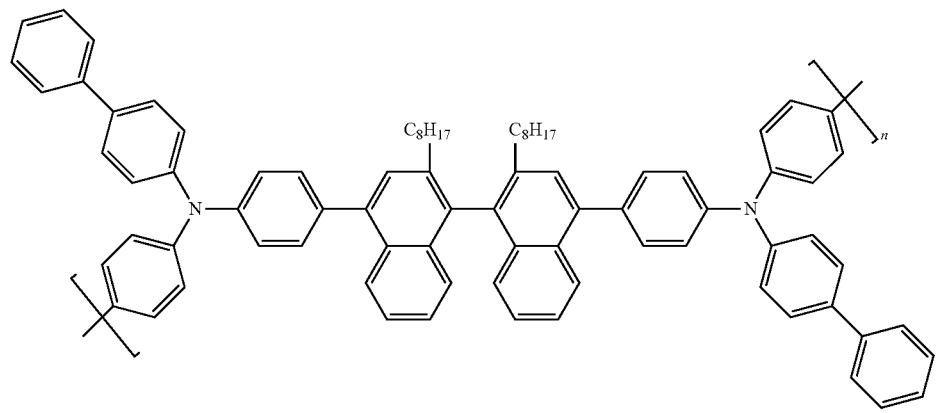

PM-1

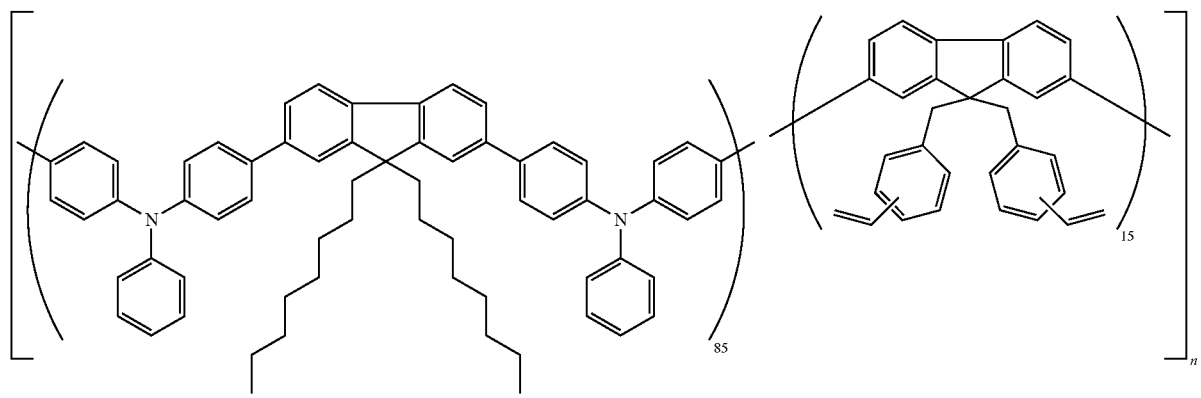

PM-2

PM-3
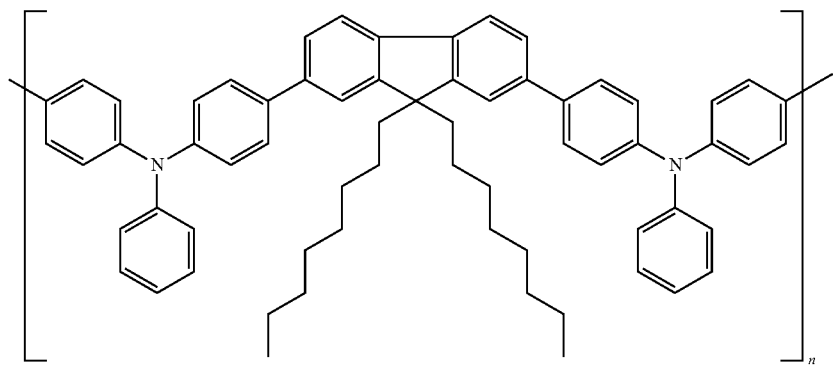
PM-4
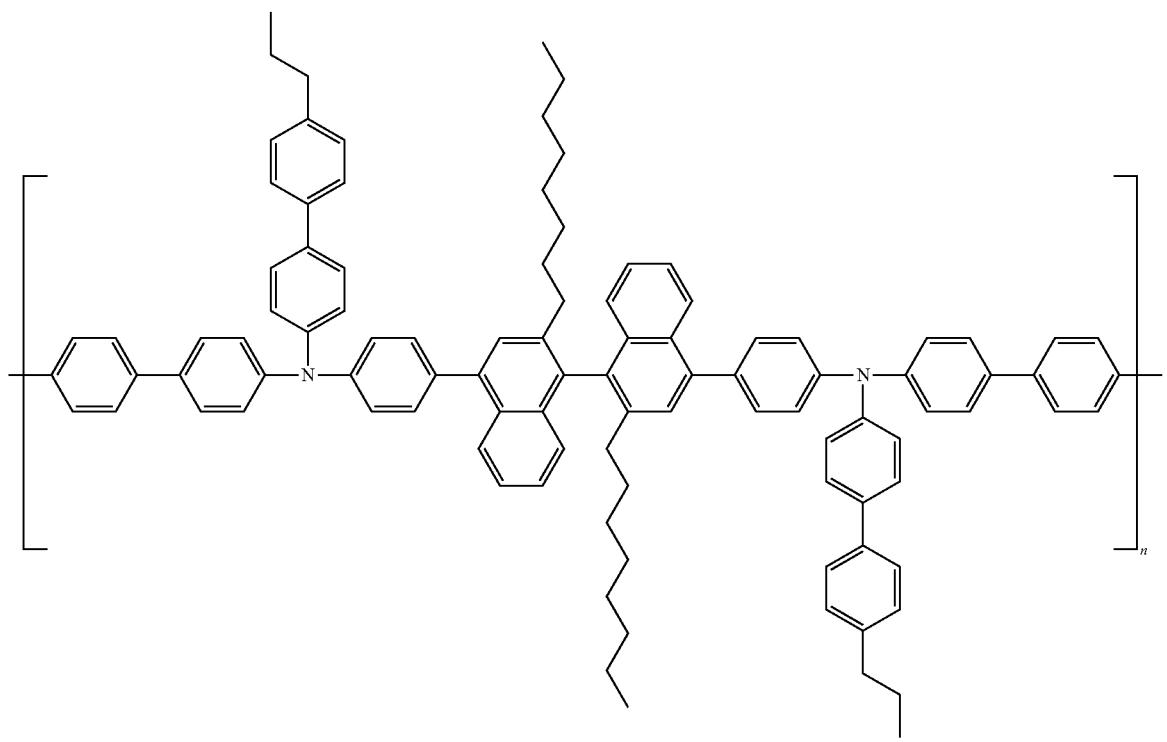
PM-5
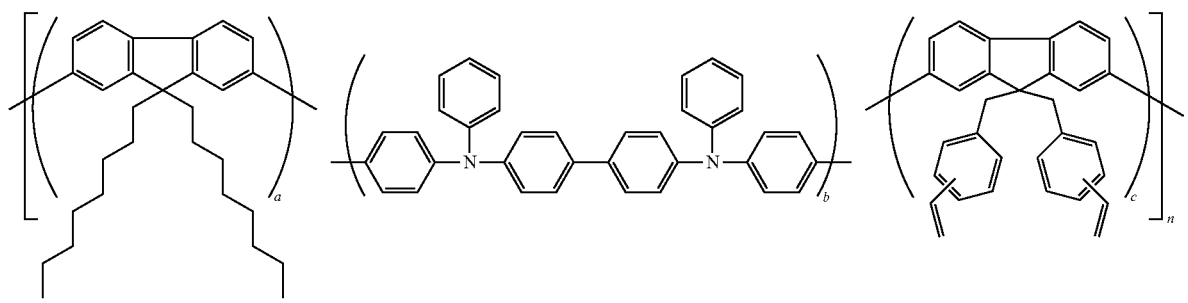
a:b:c = 4:5:1

-continued
PM-6
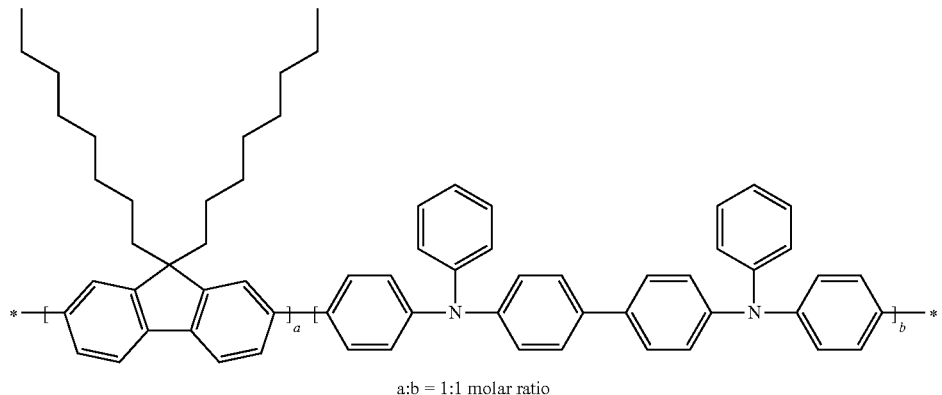
a:b = 1:1 molar ratio
PM-7
PM-8
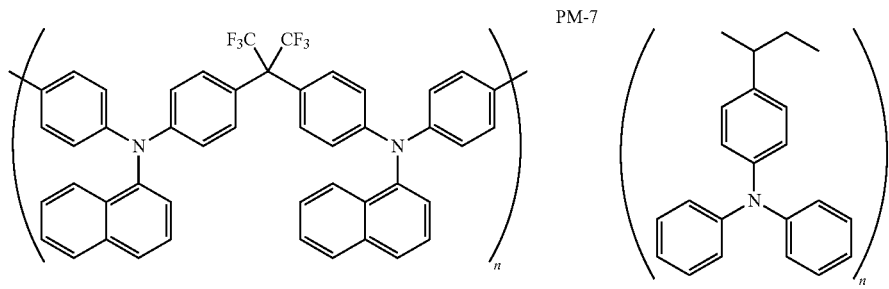
PM-9
PM-10
R = 2-ethylhexyl
PM-11
PM-12
PM-13
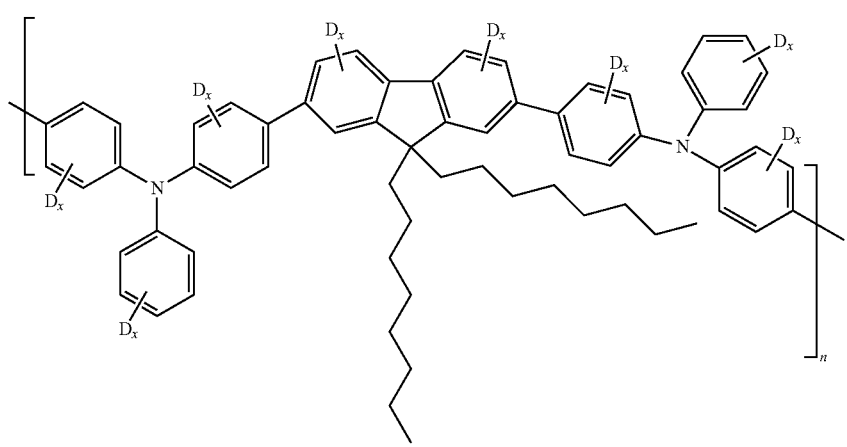
x is 0-5 and Σ(x) = 10-32

PM-8 through PM-12 are well known compounds. The preparation compound such as PM-1 and PM-4 has been previously described in published PCT application WO 2009/067419. The preparation of compounds such as PM-2, PM-3, and PM-6 has been described in published PCT applications WO 2008/024378 and WO 2008/024379. The preparation of compounds such as PM-7 has been described in published US patent application 2005-0187411.

Deuterated priming material PM-13 can be prepared as follows.

Synthesis of Compound 2

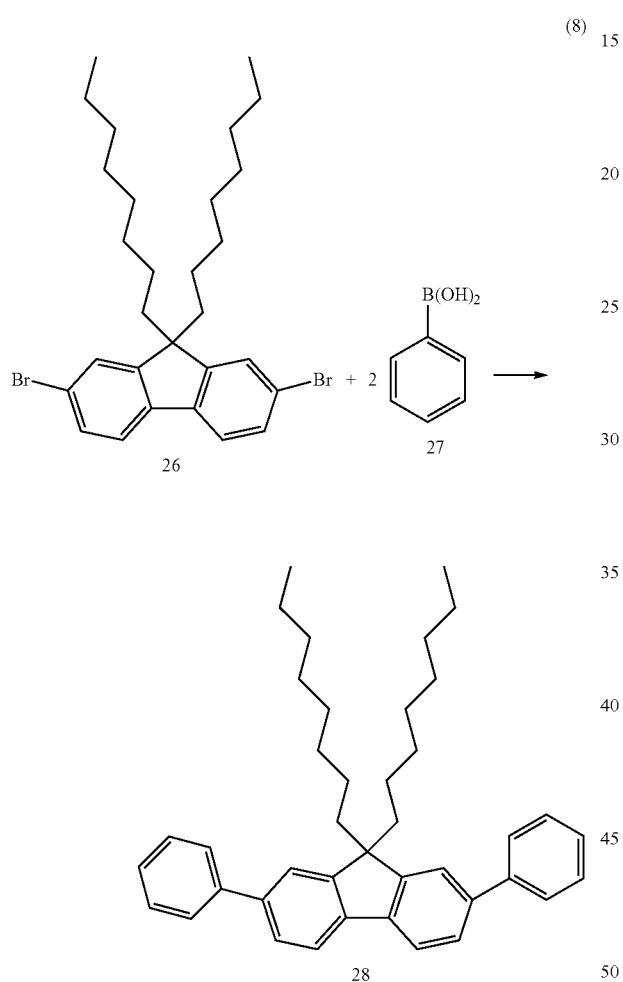

Under an atmosphere of nitrogen, a 250 mL round bottom was charged with 9,9-dioctyl-2,7-dibromofluorene (25.0 g, 45.58 mmol), phenylboronic acid (12.23 g, 100.28 mmol), Pd$_2$(dba)$_3$ (0.42 g, 0.46 mmol), P$^t$Bu$_3$ (0.22 g, 1.09 mmol) and 100 mL toluene. The reaction mixture stirred for five minutes after which KF (8.74 g, 150.43 mmol) was added in two portions and the resulting solution was stirred at room temperature overnight. The mixture was diluted with 500 mL THF and filtered through a plug of silica and celite and the volatiles were removed from the filtrate under reduced pressure. The yellow oil was purified by flash column chromatography on silica gel using hexanes as eluent. The product was obtained as a white solid in 80.0% (19.8 g). Analysis by NMR indicated the material to be compound 2 having structure given above.

Synthesis of Compound 3

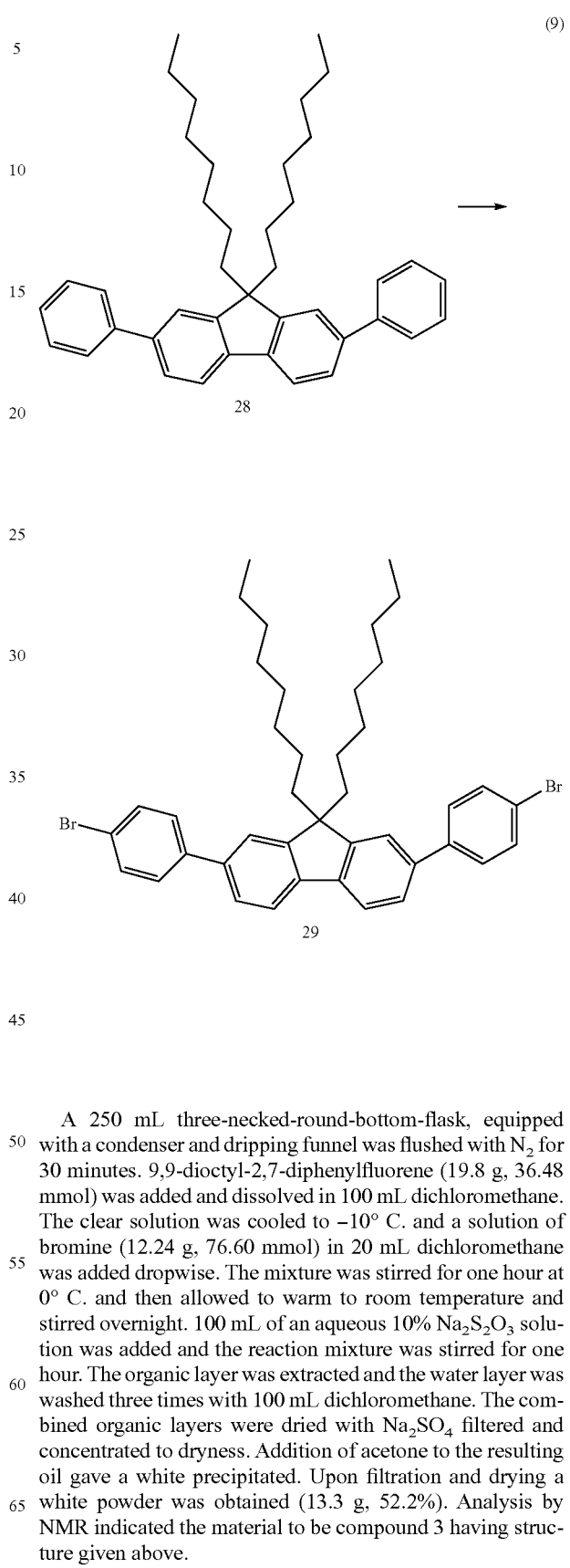

A 250 mL three-necked-round-bottom-flask, equipped with a condenser and dripping funnel was flushed with N$_2$ for 30 minutes. 9,9-dioctyl-2,7-diphenylfluorene (19.8 g, 36.48 mmol) was added and dissolved in 100 mL dichloromethane. The clear solution was cooled to −10° C. and a solution of bromine (12.24 g, 76.60 mmol) in 20 mL dichloromethane was added dropwise. The mixture was stirred for one hour at 0° C. and then allowed to warm to room temperature and stirred overnight. 100 mL of an aqueous 10% Na$_2$S$_2$O$_3$ solution was added and the reaction mixture was stirred for one hour. The organic layer was extracted and the water layer was washed three times with 100 mL dichloromethane. The combined organic layers were dried with Na$_2$SO$_4$ filtered and concentrated to dryness. Addition of acetone to the resulting oil gave a white precipitated. Upon filtration and drying a white powder was obtained (13.3 g, 52.2%). Analysis by NMR indicated the material to be compound 3 having structure given above.

Synthesis of Compound 4

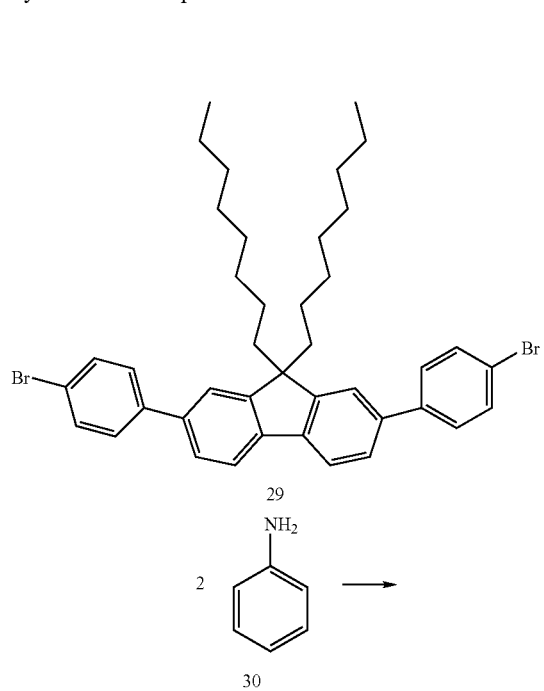

(10)

Under an atmosphere of nitrogen, a 250 mL round bottom was charged with 3 (13.1 g, 18.70 mmol), aniline (3.66 g, 39.27 mmol), Pd$_2$(dba)$_3$ (0.34 g, 0.37 mmol), P$^t$Bu$_3$ (0.15 g, 0.75 mmol) and 100 mL toluene. The reaction mixture stirred for 10 min after which NaO$^t$Bu (3.68 g, 38.33 mmol) was added and the reaction mixture was stirred at room temperature for one day. The resulting reaction mixture was diluted with 3 L toluene and filtered through a plug of silica and celite. Upon evaporation of volatiles, the dark brown oil obtained was purified by flash column chromatography on silica gel using a mixture of 1:10 ethyl acetate: hexanes as eluent. The product was obtained as a pale yellow powder in 50.2% (6.8 g). Analysis by NMR indicated the material to be compound 4 having structure given above.

Synthesis of Compound 5

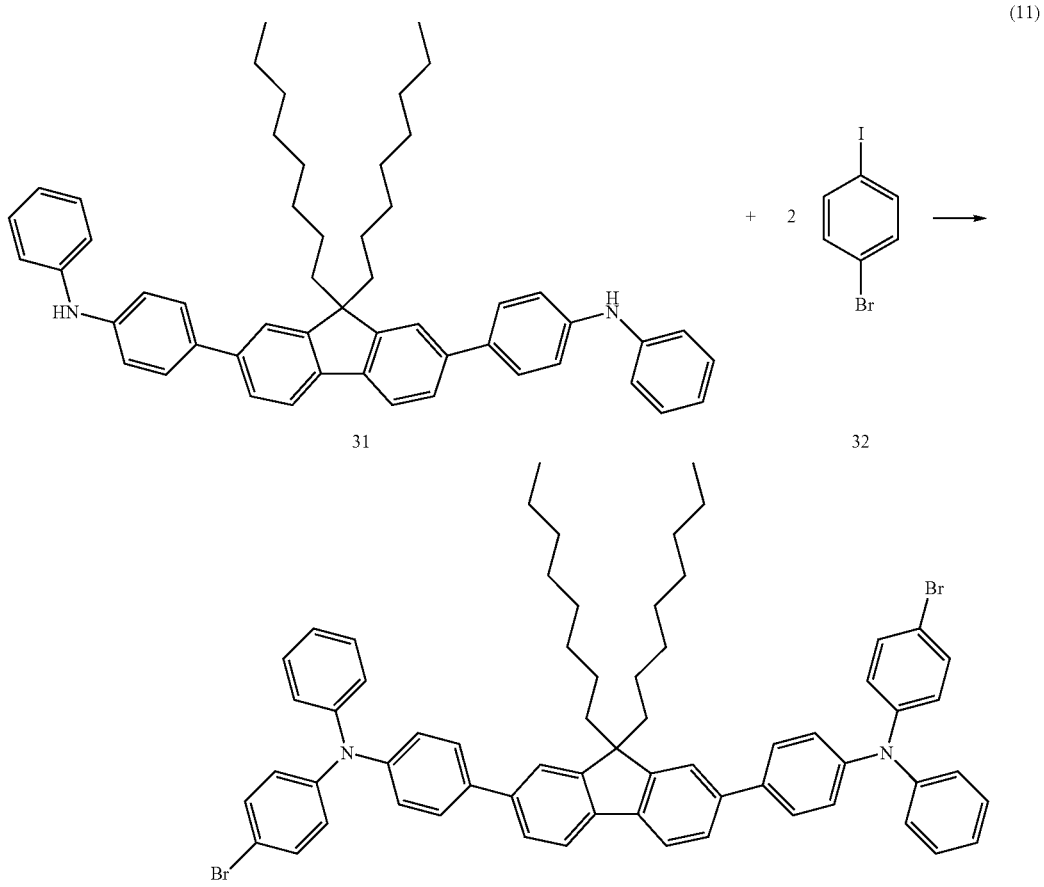

(11)

In a 250 mL three-necked-round-bottom-flask equipped with condenser, 4 (4.00 g, 5.52 mmol), 1-bromo-4-iodobenzene (4.68 g, 16.55 mmol), $Pd_2(dba)_3$ (0.30 g, 0.33 mmol) and DPPF (0.37 g, 0.66 mmol) were combined with 80 mL toluene. The resultant mixture was stirred for 10 min. NaO$^t$Bu (1.17 g, 12.14 mmol) was added and the mixture was heated to 80° C. for four days. The resulting reaction mixture was diluted with 1 L toluene and 1 L THF filtered through a plug of silica and celite to remove the insoluble salts. Upon evaporation of volatiles, the resulting brown oil was purified by flash column chromatography on silica gel using a mixture of 1:10 dichloromethane:hexanes as eluent. After drying a yellow powder was obtained (4.8 g, 84.8%). Analysis by NMR indicated the material to be compound 5 having structure given above.

Synthesis of Compound 6

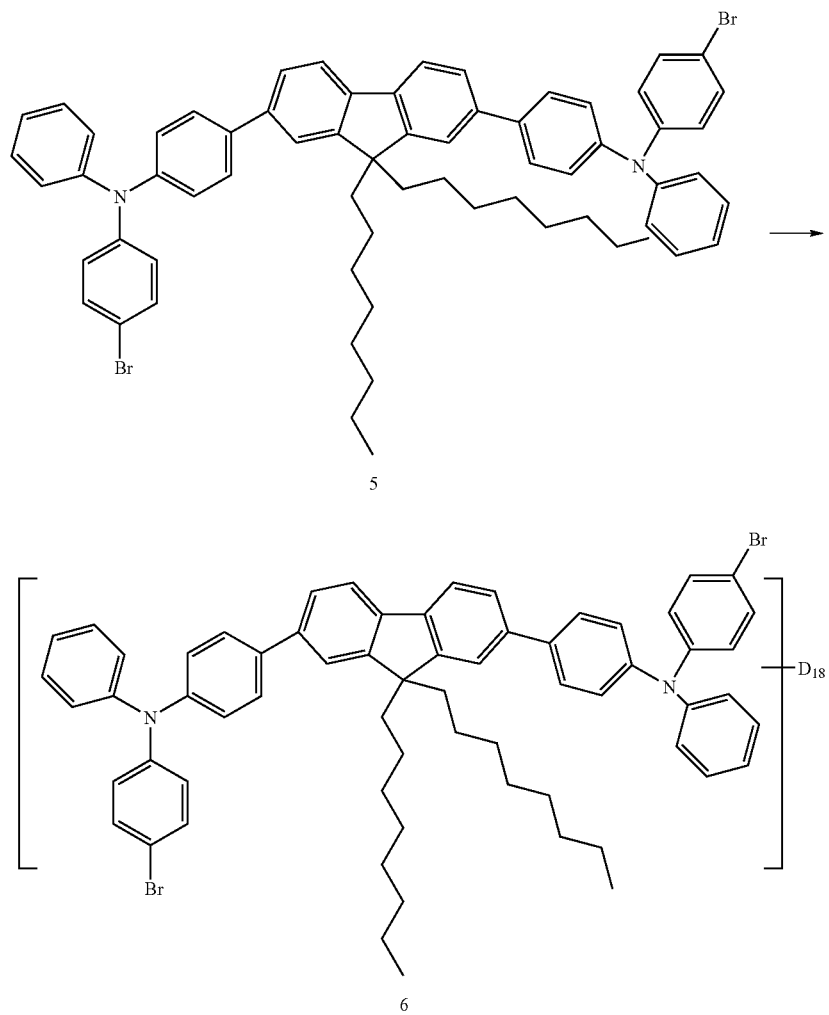

Under an atmosphere of nitrogen 1 g of compound 5 was dissolved in $C_6D_6$ (20 mL) to which $CF_3OSO_2D$ (1.4 mL) was added dropwise. The reaction mixture was allowed to stir at room temperate overnight and then it was quenched with satd. $Na2CO_3/D_2O$. The organic layer was isolated and dried over $MgSO_4$. The product was purified using silica chromatography (20% CH2Cl2:hexane) to yield 0.688 g of material. The MS spectrum of the isolated material confirmed the structure with 18 aromatic D.

Polymerization of Compound 6:

All operations were carried out in a nitrogen purged glovebox unless otherwise noted. Compound 6 (0.652 g, 0.50 mmol) was added to a scintillation vial and dissolved in 16 mL toluene. A clean, dry 50 mL Schlenk tube was charged with bis(1,5-cyclooctadiene)nickel(0) (0.344 g, 1.252 mmol). 2,2'-Dipyridyl (0.195 g, 1.252 mmol) and 1,5-cyclooctadiene (0.135 g, 1.252 mmol) were weighed into a scintillation vial and dissolved in 3.79 g N,N'-dimethylformamide. The solution was added to the Schlenk tube. The Schlenk tube was inserted into an aluminum block and the block was heated and stirred on a hotplate/stirrer at a setpoint that resulted in an internal temperature of 60° C. The catalyst system was held at 60° C. for 45 minutes and then raised to 65° C. The monomer solution in toluene was added to the Schlenk tube and the tube was sealed. The polymerization mixture was stirred at 65° C. for one while adjusting viscosity by adding toluene (8 mL). The reaction mixture was allowed to cool to room temperature and 20 mL of conc. HCl was added. The mixture was allowed to stir for 45 minutes. The polymer was collected by vacuum filtration and washed with additional methanol and dried under high vacuum. The polymer was purified by successive precipitations from toluene into acetone and MeOH, A white, fibrous polymer (0.437 g, 79% yield) was obtained. The molecular weight of the polymer was determined by GPC (THF mobile phase, polystyrene standards): $M_w=1,696,019$; $M_n=873,259$. NMR analysis confirmed the structure to be the polymer, Compound PM-13. Additional materials include:

HIJ-1, which is an aqueous dispersion of an electrically conductive polymer and a polymeric fluorinated sulfonic acid. Such materials have been described in, for example, published U.S. patent applications US 2004/0102577, US 2004/0127637, US 2005/0205860, and published PCT application WO 2009/018009.

HIJ-2, which is an aqueous dispersion of an electrically conductive polymer, a polymeric fluorinated sulfonic acid, and inorganic nanoparticles. Such materials have been described in, for example, published U.S. patent applications US 2004/0102577, US 2004/0127637, US 2005/0205860, and published PCT application WO 2009/018009.

Examples 1-10

These examples illustrate different priming materials and the resulting change in contact angle, where the priming layer is formed by liquid deposition and developed by treatment with a liquid.

Test coupons were prepared by spin-coating an aqueous dispersion of HIJ-1 or HIJ-2 onto a glass substrate to a thickness of 50 nm. After drying this layer, a priming layer was formed by spin coating a solution of the priming material onto the dried HIJ layer. In Examples 1-8 and 10, the priming material was spin coated from toluene. In Example 9, the priming material was spin coated from dichloromethane. After drying, the priming layer was exposed to radiation in a pattern. In Examples 1-6 and 8-9, the exposure was at 248 nm with a dosage of 100 mJ/cm². In Example 7, the exposure dosage was 200 mJ/cm². In Example 10, there were multiple exposures: 248 nm (1 J/cm²), 365 nm (13 J/cm²), 405 nm (3 J/cm²), and 436 nm (8 J/cm²). After exposure, the priming layer was developed by treatment with a solvent. In Examples 1-4 and 10, the samples were developed by soaking in toluene with agitation, rinsing with toluene, and then dried with nitrogen. In Examples 5 and 8, the samples were developed by spraying with xylene while spinning at 2000 rpm for 60 s and then dried by spinning for 30 s. In Example 6, the sample was developed by spraying with anisole while spinning at 2000 rpm for 60 s and then dried for spinning for 30 s. In Example 7, the sample was developed by spraying with toluene while spinning at 2000 rpm for 60 s and then dried by spinning for 30 s. In Example 9, the sample was developed by spraying with dichloromethane while spinning at 2000 rpm for 60 s and then dried by spinning for 30 s. A summary of the materials and results is given in Table 1.

TABLE 1

Test Coupon Results

| Example | 1st Layer | Priming Layer | Contact Angle with Methyl Benzoate | |
|---|---|---|---|---|
| | | | Exposed | Unexposed |
| 1 | HIJ-1 | PM-1 | <5° | 48° |
| 2 | HIJ-1 | PM-2 | <5° | 45° |
| 3 | HIJ-1 | PM-3 | <5° | 49° |
| 4 | HIJ-1 | PM-4 | <5° | 48° |
| 5 | HIJ-1 | PM-5 | <5° | 52° |
| 6 | HIJ-2 | PM-6 | <5° | 32° |
| 7 | HIJ-1 | PM-7 | <5° | 47° |
| 8 | HIJ-2 | PM-8 | <5° | 43° |
| 9 | HIJ-2 | PM-9 | <5° | 45° |
| 10 | HIJ-1 | PM-10 | 23° | 47° |

Examples 11-12

These examples illustrate different priming materials and the resulting change in contact angle, where the priming layer is formed by vapor deposition and developed by heating.

The test coupons were prepared by depositing HIJ-1 onto a glass substrate as described above. The priming layer was then formed by vapor depositing the priming material in a thermal evaporator. The priming layer was then exposed and developed by baking. In Example 11, the exposure was at 248 nm with a dosage of 400 mJ/cm². The coupon was developed by baking at 225° C. for 5 minutes. In Example 12, there were multiple exposures: 248 nm (1 J/cm²), 365 nm (13 J/cm²), 405 nm (3 J/cm²), and 436 nm (8 J/cm²). The coupon was developed by baking at 275° C. for 5 minutes. A summary of the materials and results is given in Table 2.

TABLE 2

Test Coupon Results

| Example | Priming Layer | Contact Angle with Methyl Benzoate | |
|---|---|---|---|
| | | Exposed | Unexposed |
| 11 | PM-11 | <5° | 53° |
| 12 | PM-12 | 20° | 56° |

Example 13 and Comparative Example A

This example illustrates a priming layer formed by liquid deposition in an electronic device where the emissive layer is formed by vapor deposition.

The device had the following structure on a glass substrate:
anode=Indium Tin Oxide (ITO): 50 nm
hole injection layer=HIJ-1 (50 nm)
primer layer: Example 13=PM-3 (20 nm)
    Comparative example A=none
hole transport layer=PM-1 (20 nm)
emissive layer=6:1 host 1:dopant 1 (32 nm), where host 1 is a diarylanthracene compound and dopant 1 is a bis(diarylamino)chrysene compound
electron transport layer=ET1, which is a metal quinolate derivative (10 nm)
cathode=CsF/Al (0.7/100 nm)

OLED devices were fabricated by a combination of solution processing and thermal evaporation techniques. A patterned indium tin oxide (ITO) coated glass substrate from Thin Film Devices, Inc was used. The ITO substrate is based on Corning 1737 glass coated with ITO having a sheet resistance of 30 ohms/square and 80% light transmission. The patterned ITO substrate was cleaned ultrasonically in aqueous detergent solution and rinsed with distilled water. The patterned ITO was subsequently cleaned ultrasonically in acetone, rinsed with isopropanol, and dried in a stream of nitrogen.

Immediately before device fabrication the cleaned, patterned ITO substrate was treated with UV ozone for 10 minutes. Immediately after cooling, an aqueous dispersion of HIJ-1 was spin-coated over the ITO surface and heated to remove solvent. After cooling, a priming layer was formed by spin coating a toluene solution of PM-3 onto the hole injection layer. The priming layer was imagewise exposed at 248 nm with a dosage of 100 mJ/cm$^2$. After exposure, the priming layer was developed by soaking in toluene with agitation and then rinsing with toluene. The developed layer was dried with nitrogen. For Comparative example A, there was no priming layer. The substrates were then spin-coated with a solution of a hole transport material, and then heated to remove solvent. After cooling, the substrates were masked and placed in a vacuum chamber. The emissive layer materials were then deposited by thermal evaporation, followed by the electron transport layer, and then a layer of CsF. Masks were then changed in vacuo and a layer of Al was deposited by thermal evaporation. The chamber was vented, and the devices were encapsulated using a glass lid, dessicant, and UV curable epoxy.

The OLED sample was characterized by measuring the (1) current-voltage (1-V) curves, (2) electroluminescence radiance versus voltage, and (3) electroluminescence spectra versus voltage. All three measurements were performed at the same time and controlled by a computer. The current efficiency of the device at a certain voltage was determined by dividing the electroluminescence radiance of the LED by the current needed to run the device. The unit is a cd/A. The power efficiency is the current efficiency multiplied by pi, divided by the operating voltage. The unit is lm/W. The resulting device data is given in Table 3.

Example 14 and Comparative Example B

This example illustrates a priming layer formed by liquid deposition in an electronic device where the emissive layer is formed by liquid deposition.

The device had the following structure on a glass substrate:
anode=Indium Tin Oxide (ITO): 50 nm
hole injection layer=HIJ-2 (50 nm)
primer layer: Example 14=PM-3 (20 nm)
   Comparative example B=none
hole transport layer=PM-1 (20 nm)
emissive layer=13:1 host 1:dopant 2 (40 nm), where dopant 2 is a bis(diarylamino)chrysene compound
electron transport layer=ET1 (10 nm)
cathode=CsF/Al (0.7/100 nm)

OLED devices were fabricated and evaluated, as described for Example 13, with the following differences: (1) the primer layer of Example 14 was developed by spraying with anisole while spinning at 2000 rpm for 60 s and then dried by spinning for 30 s; and (2) the emissive layer in Example 14 and Comparative example B, was deposited by spin coating from a methyl benzoate solution.

The resulting device data is given in Table 3.

Example 15 and Comparative Example C

This example illustrates a priming layer formed by vapor deposition in an electronic device where the emissive layer is formed by vapor deposition.

The device had the following structure on a glass substrate:
anode=Indium Tin Oxide (ITO): 50 nm
hole injection layer=HIJ-1 (50 nm)
primer layer: Example 15=PM-11 (20 nm)
   Comparative example C=none
hole transport layer=PM-1 (20 nm)
emissive layer=6:1 host 1:dopant 1 (32 nm)
electron transport layer=ET1 (10 nm)
cathode=CsF/Al (0.7/100 nm)

OLED devices were fabricated and evaluated, as described for Example 13, with the following differences: (1) the primer layer of Example 15 was formed by vapor deposition in a thermal evaporator; and (2) the primer layer of Example 15 was developed by baking at 225° C. for 5 minutes.

The resulting device data is given in Table 3.

Example 16 and Comparative Example D

This example illustrates a priming layer formed by liquid deposition in an electronic device where the emissive layer is formed by liquid deposition.

The device had the following structure on a glass substrate:
anode=ITO: 50 nm
hole injection layer=HIJ-2 (50 nm)
primer layer: Example 16=PM-13 (20 nm)
   Comparative example D=none
hole transport layer=PM-1 (20 nm)
emissive layer=13:1 host 2:dopant 2 (40 nm), where host 2 is a deuterated diarylanthracene compound
electron transport layer=ET1 (10 nm)
cathode=CsF/Al (1/100 nm)

OLED devices were fabricated and evaluated, as described for Example 14.

The resulting device data is given in Table 3.

TABLE 3

Device Performance

| Ex. | Priming Layer | CIE (x, y) | Voltage (V) | EQE | CE | PE. | Lifetest current density | Lifetest Lum. | Raw T50 | Proj. Lifetime T50 |
|---|---|---|---|---|---|---|---|---|---|---|
| Comp. A | none | 0.138, 0.108 | 3.7 | 8.4 | 7.6 | 6.5 | 125 | 7694 | 183 | 5874 |
| Ex. 13 | PM-3 | 0.137, 0.114 | 3.7 | 8.7 | 8.5 | 7.2 | 123 | 8679 | 180 | 7090 |
| Comp. B | none | 0.134, 0.135 | 4.7 | 5.9 | 6.4 | 4.3 | 177 | 9092 | 233 | 9933 |
| Ex. 14 | PM-3 | 0.134, 0.140 | 4.9 | 6.0 | 6.6 | 4.3 | 185 | 9740 | 200 | 9585 |
| Comp. C | none | 0.139, 0.108 | 3.8 | 8.0 | 7.5 | 6.2 | 129 | 7565 | 174 | 5427 |

TABLE 3-continued

Device Performance

| Ex. | Priming Layer | CIE (x, y) | Voltage (V) | EQE | CE | PE. | Lifetest current density | Lifetest Lum. | Raw T50 | Proj. Lifetime T50 |
|---|---|---|---|---|---|---|---|---|---|---|
| Ex. 15 | PM-11 | 0.138, 0.109 | 4.8 | 8.5 | 8.0 | 5.3 | 123 | 7519 | 105 | 3241 |
| Comp. D | none | 0.135, 0.133 | 5.0 | 5.9 | 6.3 | 4.0 | 130 | 7037 | 541 | 14914 |
| Ex. 16 | PM-13 | 0.134 0.137 | 4.9 | 5.8 | 6.4 | 4.2 | 126 | 6757 | 609 | 15681 |

All data @ 1000 nits;
CIE(x, y) are the x and y color coordinates according to the C.I.E. chromaticity scale (Commission Internationale de L'Eclairage, 1931);
CE = current efficiency, in cd/A;
EQE = external quantum efficiency, in %;
PE = power efficiency, in lm/W;
Lifetest current density in mA/cm$^2$;
Lifetest Lum. = luminance in nits;
Raw T50 is the time in hours for a device to reach one-half the initial luminance at the lifetest luminance given.
Projected T50 is the projected lifetime in hours at 1000 nits using an accelerator factor of 1.7.

It can be seen from Table 3 that device performance is not adversely affected by the presence of the priming layer.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A process for forming a contained second layer over a first layer, said process comprising:
    forming the first layer having a first surface energy;
    treating the first layer with a priming layer;
    exposing the priming layer patternwise with radiation resulting in exposed areas and unexposed areas;
    developing the priming layer to effectively remove the priming layer from the unexposed areas resulting in a first layer having a pattern of priming layer, wherein the pattern of priming layer has a second surface energy that is higher than the first surface energy; and
    forming the second layer by liquid deposition on the pattern of the exposed priming layer on the first layer.

2. The process of claim 1, wherein developing is carried out by treating with a liquid.

3. The process of claim 1, wherein developing is carried out by evaporation.

4. The process of claim 1, wherein developing is carried out by contacting an outermost surface of the unexposed areas with an absorbent surface.

5. The process of claim 1, wherein developing is carried out by contacting an outermost surface of the unexposed areas with an adhesive surface.

6. A process for making an organic electronic device comprising an electrode having positioned thereover a first organic active layer and a second organic active layer, said process comprising
    forming the first organic active layer having a first surface energy over the electrode;
    treating the first organic active layer with a priming layer;
    exposing the priming layer patternwise with radiation resulting in exposed areas and unexposed areas;
    developing the priming layer to effectively remove the priming layer from the unexposed areas or the unexposed areas resulting in a first active organic layer having a pattern of priming layer, wherein the pattern of priming layer has a second surface energy that is higher than the first surface energy; and
    forming the second organic active layer by liquid deposition on the pattern of priming layer on the first organic active layer.

7. The process of claim 6, wherein the first active layer is a hole transport layer and the second active layer is a emissive layer.

8. The process of claim 6, wherein the first active layer is a hole injection layer and the second active layer is a hole transport layer.

9. The process of claim 8, wherein the hole injection layer comprises a conductive polymer and a fluorinated acid polymer.

10. The process of claim 8, wherein the hole injection layer consists essentially of a conductive polymer doped with a fluorinated acid polymer and inorganic nanoparticles.

11. The process of claim 8, wherein the priming layer comprises hole transport material.

12. The process of claim 8, wherein the priming layer comprises a material selected from the group consisting of polymeric triarylamines, polycarbazoles, polyfluorenes, polymeric triarylamines having conjugated moieties which are connected in a non-planar configuration, copolymers of fluorene and triarylamine, metal quinolates, deuterated analogs thereof, and combinations thereof.

13. The process of claim 8, wherein the hole transport layer is selected from the group consisting of polymeric triarylamines, polymeric triarylamines having conjugated moieties which are connected in a non-planar configuration, and copolymers of fluorene and triarylamines.

14. The process of claim 8, further comprising forming an emissive layer by liquid deposition on the hole transport layer.

* * * * *